(12) United States Patent
Qian et al.

(10) Patent No.: US 11,488,501 B2
(45) Date of Patent: Nov. 1, 2022

(54) SYSTEM, METHOD AND APPARATUS FOR DIRECTED LED DISPLAY

(71) Applicant: Media Resources Inc., Oakville (CA)

(72) Inventors: Cheng Qian, Oakville (CA); Graham Murdoch, Mississauga (CA)

(73) Assignee: Media Resources Inc., Oakville, CA (US)

( * ) Notice: Subject to any disclaimer, the term of this patent is extended or adjusted under 35 U.S.C. 154(b) by 0 days.

(21) Appl. No.: 15/348,798

(22) Filed: Nov. 10, 2016

(65) Prior Publication Data
US 2018/0130385 A1    May 10, 2018

(51) Int. Cl.
*G09F 9/33* (2006.01)
*G09F 27/00* (2006.01)
*G06F 30/20* (2020.01)

(52) U.S. Cl.
CPC ............... *G09F 9/33* (2013.01); *G06F 30/20* (2020.01); *G09F 27/008* (2013.01)

(58) Field of Classification Search
CPC ..... F21V 11/06; G06F 17/5009; G09F 27/008
See application file for complete search history.

(56) References Cited

U.S. PATENT DOCUMENTS

| | | | | |
|---|---|---|---|---|
| 5,149,191 A * | 9/1992 | Lewin | ...................... | F21V 11/06 362/290 |
| 5,685,634 A * | 11/1997 | Mulligan | ................ | G09F 9/307 362/237 |
| 5,949,581 A * | 9/1999 | Kurtenbach | .............. | G09F 9/33 359/623 |
| 6,329,593 B1 * | 12/2001 | Yang | ......................... | G09F 9/33 174/50.5 |
| 6,364,507 B1 * | 4/2002 | Yang | ..................... | G09F 27/008 362/240 |
| 6,536,913 B1 * | 3/2003 | Yajima | ...................... | G09F 9/33 362/231 |

(Continued)

FOREIGN PATENT DOCUMENTS

| | | | | |
|---|---|---|---|---|
| DE | 0962911 | * | 12/1999 | ............... G09F 9/33 |
| JP | 2002055632 | * | 2/2002 | ........... G09F 27/008 |

OTHER PUBLICATIONS

English Machine translation of EP 0962911 provided by ESPACENET (Year: 1999).*

*Primary Examiner* — Zheng Song
(74) *Attorney, Agent, or Firm* — Benesch, Friedlander, Coplan & Aronoff, LLP

(57) ABSTRACT

The present invention is an optical LED light display incorporating one or more louvers operable to limit the light emission in a specified direction from a LED diode within the LED light display, each louvers being positioned in relation to each LED light element in the LED light display. The specified direction of the light emission may be towards a target audience or a target direction. A method of the present invention that may be implemented by a software program processed by computer processors of a computer device, may be operable to enable the design of the LED display louver for installation in a specific area to enable simultaneous elimination of light trespass and preservation of image quality for the target audience. A LED light display can be manufactured, configured and installed in accordance with the method.

15 Claims, 9 Drawing Sheets

(56) References Cited

U.S. PATENT DOCUMENTS

| | | | | |
|---|---|---|---|---|
| 7,559,673 B2* | 7/2009 | Meersman | ............... | G09F 9/30 |
| | | | | 362/245 |
| 8,350,788 B1* | 1/2013 | Nearman | .............. | G09F 9/3026 |
| | | | | 315/169.3 |
| 8,371,137 B2* | 2/2013 | De Ryckel | ............ | G09F 27/008 |
| | | | | 359/601 |
| 9,903,561 B1* | 2/2018 | Chen | .................... | F21V 7/0083 |
| 2014/0313718 A1* | 10/2014 | Marquardt | ............ | F21V 7/0066 |
| | | | | 362/241 |
| 2015/0276142 A1* | 10/2015 | Hatano | .................. | F21V 11/16 |
| | | | | 362/249.01 |
| 2017/0023207 A1* | 1/2017 | Hayashi | ............... | F21V 7/0083 |

* cited by examiner

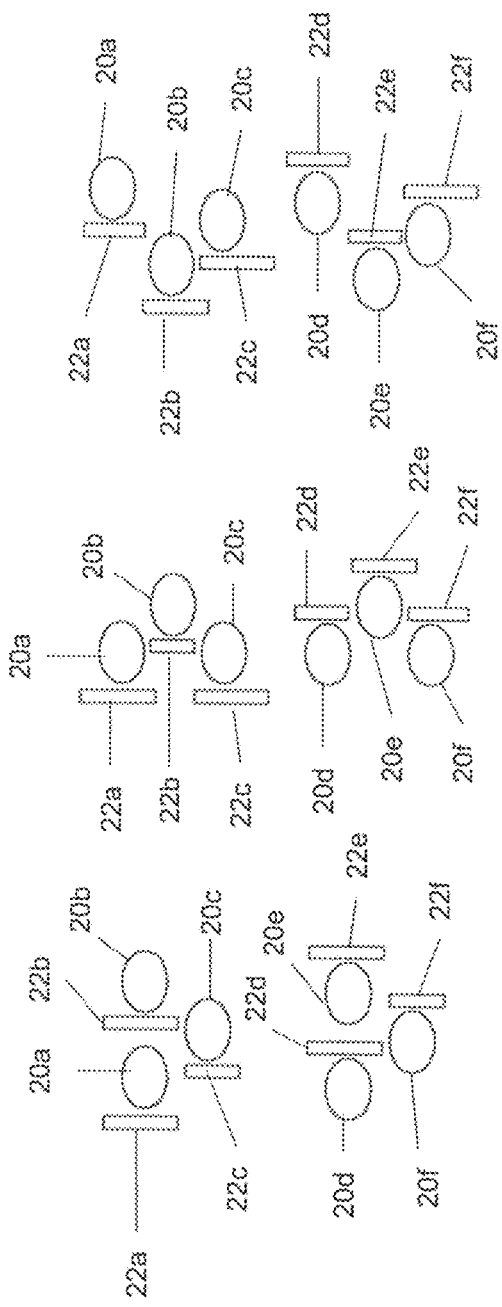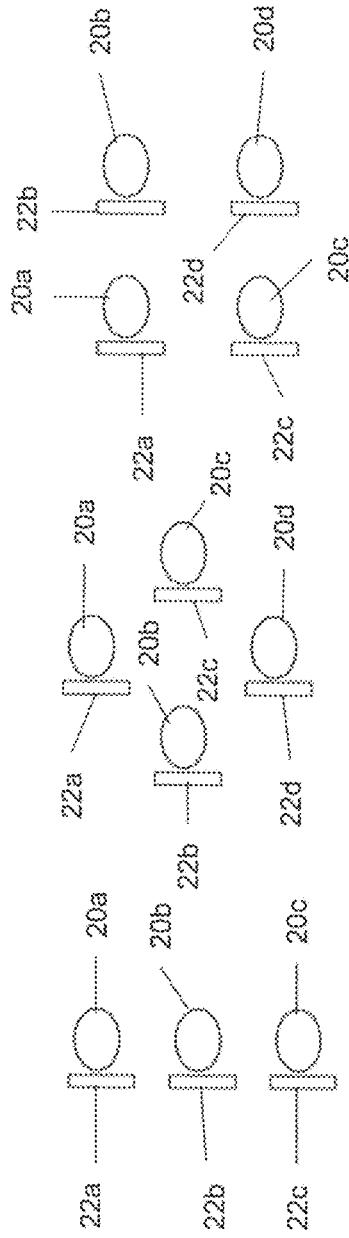

SYSTEM, METHOD AND APPARATUS FOR DIRECTED LED DISPLAY

FIELD OF INVENTION

This invention relates in general to the field of LED light displays and more particularly to directing the light emission from LED light displays.

BACKGROUND OF THE INVENTION

Prior art light-emitting diode (LED) light displays are flat panel displays that incorporate an array of light-emitting diodes to produce a display, for example, such as a visual display of information. The diodes function as pixels in the display. The brightness of an LED light display allows it to be used outdoors or indoors. LED light displays are commonly utilized as store signs, billboards, destination signs on public transport vehicles, and for other purposes of displaying information to an audience. LED light displays are further utilized to provide illumination that may be decorative or technical, such as stage lighting or seasonal display lighting.

Generally a LED light display emits light from the entire forward side of the diodes, and therefore light is emitted from the LED light display in a hemispherical direction. In fact the purpose of traditional outdoor LED displays used in advertising has been to provide the best image quality at the widest possible view angles. As a result of this goal, most prior art outdoor LED displays share a few common optical features: wide-angle oval LEDs which provide wide horizontal view angles but a compressed vertical view angles; horizontal louvers on the physical faces of the LEDs which provide sun-shading and UV protection for the LEDs and improved visual contrast; and a layout of the red green and blue elements in each pixel in such a way that minimizes cross-blocking between pixels. Therefore, most outdoor LED displays have very similar optical performance across all manufacturers.

The result is that light emission is directed towards a target audience, as well as in the direction of other environments where the target audience is not present. Light trespass, which is the emission of light into areas where the target audience is not present and where there is no purpose for the light to be emitted, occurs and can in fact be a source of consternation for areas that are sensitive to light trespass. For example, residential neighborhoods, airport facilities, and protected nature reserves are all areas which are highly intolerant to light trespass, and traditionally would prevent or block the authorization for and installation of an LED display.

The prior art includes many different methods and techniques to manipulate the optical output pattern of LED elements, whether static or changeable. The prior art can be grouped into three categories: 1) LED elements for use with luminaires, 2) lenses for lighting elements for improvement of optical performance by means of increasing light utilization ratio (i.e., the ratio of light arriving at a target audience to a total amount of light emitted), or 3) louvers for the shading of LED diodes from sunlight.

Examples of prior art designed for luminaires includes U.S. Pat. No. 8,622,573 for LED Array Beam Control Luminaries, issued to ROBE Lighting s.r.o. on Jan. 7, 2014, and US Patent Application Publication No. 2015/0192274 (patent application Ser. No. 14/148,546 filed Jan. 6, 2014), owned by Frantisek Kubis and Pavel Jurik on publication date Jul. 9, 2015. This patent and patent application disclose inventions that seek to use an optical cover design to mitigate some of the optical disadvantage of an LED array luminaire, namely color fringing, beam angle control and light spill management. Such LED array luminaires are configured to typically include many LED elements within one reflective enclosure. Thus, the configuration differs from LED displays that are configured to incorporate elements in a planar grid that are individually exposed without a cover.

The second category of prior art includes LED optics applied to individual LED diodes, such as is disclosed in U.S. Pat. No. 6,603,243 for LED Light Source with Field-of-View-Controlling Optics, issued to Teledyne Technologies Incorporated on Aug. 5, 2003. An LED element is disclosed that incorporates an integrated lens and internal optical reflectors. The LED element is utilized to focus light output slightly downward to target the intended audience, and to improve efficiency by maximizing the light utilization ratio.

U.S. Pat. No. 9,347,644 for Lens and Light Source Unit, issued to Sharp Kabushiki Kaisha on May 24, 2016, further discloses the integration of a lens cap upon each LED diode. The lens cap is used to guide the light source to highly oblique directions from the light source, or further to split the output of light into multiple non-continuous directions.

U.S. Pat. No. 8,848,139 for Optical Member, Light Source Apparatus, Display Apparatus, and Terminal Apparatus, issued to NLT Technologies, Ltd. on Sep. 30, 2014, discloses various designs for a Fresnel lens cover sheet to be used for the purpose of focusing light output to a desired observation point to maximize the light utilization ratio while maintaining image uniformity. This is achieved by the optical design of covers residing on top of Liquid Crystal Display (LCD) assemblies. This prior art pertains only to small-scale displays such as computer monitors, mobile phones, and other terminal displays. This technology cannot be applied reasonably to a large format LED display. This is so because a large format LED display is not a planar light emitter, and it is not mechanically feasible to apply this prior art to an LED display due to the 2-3 orders of magnitude increase in size compared to a LCD.

U.S. Pat. No. 868,677 for Directionally Filtered Indicator Light, issued to The Boeing Company on Apr. 1, 2014, that discloses a directionally filtered indicator light that incorporates a directional filter applied to a light source. The light is controlled to emit light when a condition or series of conditions are met. The directional filter regulates the transmission of light from the light source such that a first group of individuals located within a viewing angle are the only individuals able to see the transmitted light.

United Kingdom patent publication no. GB2417817 for Traffic Signals, owned by AGD Systems Ltd. as of publication date Aug. 26, 2009, discloses a pedestrian traffic signal having a housing that contains a light source. The housing further incorporate a viewing angle control screen formed of a flat material. This invention is operable to affect the viewability of the traffic signal from particular viewing angles by a pedestrians.

The third category of prior art includes louvers that shade LEDs from sunlight to provide protection to the LEDs from mechanical and sun damage, as well as to improve visual contrast of the display. Some examples of such patents include U.S. Pat. No. 9,202,394 for Method and Design for Shading in a Display System, issued to Barco NV on Dec. 1, 2015, which discloses a louver design and attachment mechanism that is connected to the LED elements themselves. (Traditionally louvers are fastened to the module body.) Another prior art example is U.S. Pat. No. 8,350,788 for Louver Panel for Electronic Sign, issued to Daktronics, Inc. on Jun. 8, 2013, that discloses louvers that protect LEDs from sunlight and visually camouflage the seams between LED modules. A further prior art example is US Patent Application Publication No. 2008/0141570 for Thermoplastic Elastomer Protective Louver Covering for Use with an Electronic Display Module (patent application Ser. No. 11/589,405 filed Oct. 30, 2006), owned by Daktronics Inc. upon the publication date of Jun. 19, 2008, that discloses the use of an elastomer material for the construction of louvers to increase impact resistance and reduce harm to a person coming into forceful contact with the display face. As an example, this prior art is a football field perimeter display. These three prior art examples describe various louvers configured to solve specialized problems, however, none of these prior art examples solve the problem of minimizing light trespass while preserving image quality for the intended audience of a LED light display.

As a further prior art example, Yaham Optoelectronics™ produces a technology wherein a sheet of arrayed lenses is attached to the front of an LED module to collimate light from wide-directional Surface Mount Device (SMD) LEDs into a narrower beam. This prior art aims to improve light utilization ratio while at simultaneously limiting off-angle output. One drawback of this prior art technology is that it has limitations for use with SMD LEDs due to the much tighter manufacturing tolerances achievable. Another drawback of this prior art technology is that it creates an extra surface for sunlight reflection from the lenses, which significantly compromises the contrast and image quality of the display. This is considered acceptable in this prior art application as it is used with Highway Variable Message Signs that only indicate text messages or directional messages. Such signs do not incorporate images, such as advertising images. Yet another drawback of this prior art, from a light trespass perspective, is that the beam is focused up to a point, and it can only achieve a reduction of light trespass to the side and cannot achieve elimination of light trespass.

There is presently a proliferation of LED displays employed to provide advertisements around the world, including along roadsides. Therefore, what is needed is a LED light display, and a system operable to create and/or position a LED light display, that is operable to: (i) minimize light trespass into unintended areas to address light trespass for light sensitive areas located near such LED displays, and to address the increasing effort by local governments to regulate and restrict the installations of such LED displays; and (ii) block light emission in directions that require protection, while preserving quality of image in the direction of the intended audience. What is further needed is, an LED light display that is designed to achieve the reduction of light trespass in the horizontal directions in digital displays, while simultaneously achieving (and not compromising) the industry gold standard in optical performance as experienced the intended target audience. What is yet further needed is a LED light display that does not have limitations for use with SMD LEDs due to the much tighter manufacturing tolerances achievable, and can function with Dual Inline Pin (DIP) oval LEDs. What is still further needed is a LED advertising displays that does not interfere with the standard and optimized optical performance of the LED elements due to modification of the light output in the intended view direction, and that fully blocks direct light output in the light trespass direction instead of merely reducing it.

SUMMARY OF THE INVENTION

In one aspect, the present disclosure relates to a LED light display apparatus comprising: a printed circuit board (PCB) positioned; one or more LED diodes connected to the PCB; one or more blocking elements, each of the one or more blocking elements being positioned proximate to at least one of the one or more LED diodes, whereby light emitted from one or more LED diodes is blocked in at least one direction; and whereby light emitted from the LED light display apparatus is blocked in at least one direction at a range of angles from the front of the LED light display apparatus in such direction, and said light being viewable as one or more images providing information to a viewer.

The LED light display apparatus further comprising three or more viewing regions in the area surrounding the LED light display apparatus, including at least the following: a first viewing region that is in front of the LED light display apparatus and within a range of angles from the front of the LED light display apparatus wherein light emission from the LED light display apparatus is visible by a viewer; a second viewing region that is within a range of angles from the front of the LED light display apparatus that is farther from the front of LED light display apparatus than the first viewing region, wherein light emission from the LED light display apparatus is diminished; and a third viewing region that is within a range of angles from the front of the LED light display apparatus that is farther from the front of the LED light display apparatus than the second viewing region, wherein light emission from the LED light display apparatus is eradicated or nearly-eradicated.

The LED light display apparatus further comprising at least one of the one or more blocking elements being horizontally light blocking louvers.

The LED light display apparatus further comprising the one or more blocking elements configured to incorporate a section attachable to the PCB, and an arm that extends away from the PCB in the same direction as the one or more LED diodes extend away from the PCB, said arm being operable to block the light from at least a portion of the LED diode it is proximate to in the direction that the light is emitted from the LED diode towards the arm of the blocking element.

The LED light display apparatus further comprising the arm of the blocking element being any of the following shapes or configurations: flat sided, semi-circular cupped, or multi-segmented.

The LED light display apparatus further comprising any of the following elements configured to block light emission from the LED diode that the blocking element is positioned proximate to: a fin, a ridge, and a cup.

The LED light display apparatus further comprising at least one of the one or more blocking elements being reflection minimization louvers configured to incorporate: a light emission blocking arm operable to block light emission from the LED diode proximate to the reflection minimization louver; and a reflection blocking flange angled in relation to the reflection of light emitted from the LED diode to block all or a portion of the such reflection. Therefore, a reflection minimization louver can effectively be a form of blocking element that has a traditional louver element that blocks light emission from an LED diode incorporated with a reflection minimization element that blocks at least a portion of light emission from a LED diode that is reflected of another surface (such as off a surface of a reflection minimization element, or a surface of a blocking louver or any other blocking element).

In another aspect, the present disclosure relates to a method to model light emission from a LED light display unit located in an installation site, comprising the steps of: obtaining a map showing an installation site; indicating a location of the LED light display unit within the installation site; positioning the LED light display at the location towards a target audience area; indicating the configuration of the LED light display; and generating a light map indicating the light emission from the LED light display unit in relation to the installation site.

The method further comprising the steps of: a user providing one of the following to indicate the location of the LED light display unit in the installation site: a GPS coordinate, or a location address; the LED light display being positioned at the location by being rotated in any direction; and the configuration of the LED light display unit being indicated through input of parameter information by a user The method further comprising the steps of: overlaying the light map upon the installation site, whereby the light emission from the LED light display unit is indicated in relation to the installation site; the user or the system reviewing the light emission and evaluating whether the light emission will affect a light sensitive area in the installation site.

The method further comprising the steps of: the user modifying the LED light display unit within the installation site to do one of the following: relocate, reposition and reconfigure the LED light display within the installation site; generating a light map indicating the light emission from the modified LED light display unit in relation to the installation site; overlaying the light map upon the installation site, whereby the light emission from the LED light display unit is indicated at the installation site; and the user or the system reviewing the light emission and evaluating whether the light emission will affect a light sensitive area in the installation site.

The method further comprising the step of indicating one or more locations within the installation site, and evaluating the light emission shown on the light map in relation to the one or more locations.

The method further comprising the step of the light map indicating two or more viewing regions in the installation site, including at least the following: a first viewing region that is in front of the LED light display unit and within a range of angles from the front of the LED light display unit, wherein light emission from the LED light display unit is visible by a viewer; a second viewing region that is within a range of angles from the front of the LED light display unit that is farther from the front of LED light display unit than the first viewing region, wherein light emission from the LED light display unit is diminished; and a third viewing region that is within a range of angles from the front of the LED light display unit that is farther from the front of LED light display unit than the second viewing region, wherein light emission from the LED light display unit is eradicated or nearly-eradicated The method further comprising the step of a computer program being generated that is operable to perform the steps of the method, said computer program being operable by the processors of a computing device that is connected to an input device, whereby a user of the method can input information to the computer program and such computer program can utilize such information.

The method further comprising the step of generating output that provides information regarding light emission from the LED light display unit as one of the following: a report, or a display.

The method further comprising the step of generating the report to be in a format required by a third party and transmitting the report to the third party.

The method further comprising the step of providing and utilizing parameter information for the configuration of the LED light display unit that includes one or more of the following: configuration of one or more blocking elements each being positioned proximate to at least one LED diode, and pixel arrangement within the LED light display unit.

In yet another aspect, the present disclosure relates to a method of configuring a LED light display, comprising the steps of: determining a target audience area in front of the LED light display being an area wherein light emission from one or more LED diodes in the LED light display is to be viewable; determining in reference to the target audience area the type of one or more blocking elements to be incorporated in the LED light display, each blocking element being positioned proximate to one of the one or more LED diodes in the LED light display and blocking at least a portion of the light emission from the LED diode in at least one direction; and determining in reference to the target audience area the pixel layout of the one or more LED diodes and one or more blocking elements in the LED light display; whereby the LED light display is configured such that light emission from the LED light display is visible in the target audience area and such light emission forms information, one or more images, or a combination of information and one or more images.

The method of configuring the LED light display comprising the further steps of: identifying any light sensitive area in an installation site where the LED light display is to be installed; generating a light map showing the light emission from the LED light display, and displaying said light map in relation to the installation site; determining if light emission will reach any light sensitive area in the installation site, such as to represent light trespass; determining any modification of location, position or configuration of the LED light display to cause light emission to not reach any light sensitive area, and to reach the target audience area in an installation site so as to provide maximum viewing quality of the information that the light emission is configured to project to a viewer in said target viewing area, to thereby model, simulate and plan the installation of the LED light display unit at the installation site; and generating one or more reports, including any of the following: a report of the location, position and configuration of the LED light display and providing said report to a third party builder of LED light displays; and a report of the location, position and configuration of the LED light display and the light emission therefrom and providing said report to a third party approver of LED light display installation at the installation site.

The method of configuring the LED light display further comprising the step of a computer program being generated that is operable to perform the steps of the method, said computer program being operable by the processors of a computing device that is connected to an input device, whereby a user of the method can input information to the computer program and such computer program can utilize such information.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

The invention will be better understood and objects of the invention will become apparent when consideration is given to the following detailed description thereof. Such description makes reference to the annexed drawings wherein:

FIG. 5a is a front view of a section of a LED light display of an embodiment of the present invention showing an example of a pixel layout pattern incorporating blocking elements.

FIG. 5b is a front view of a section of a LED light display of an embodiment of the present invention showing an example of a pixel layout pattern incorporating blocking elements.

FIG. 5c is a front view of a section of a LED light display of an embodiment of the present invention showing an example of a pixel layout pattern incorporating blocking elements.

FIG. 5d is a front view of a section of a LED light display of an embodiment of the present invention showing an example of a pixel layout pattern incorporating blocking elements.

FIG. 5e is a front view of a section of a LED light display of an embodiment of the present invention showing an example of a pixel layout pattern incorporating blocking elements.

FIG. 5f is a front view of a section of a LED light display of an embodiment of the present invention showing an example of a pixel layout pattern incorporating blocking elements.

Figure 1:
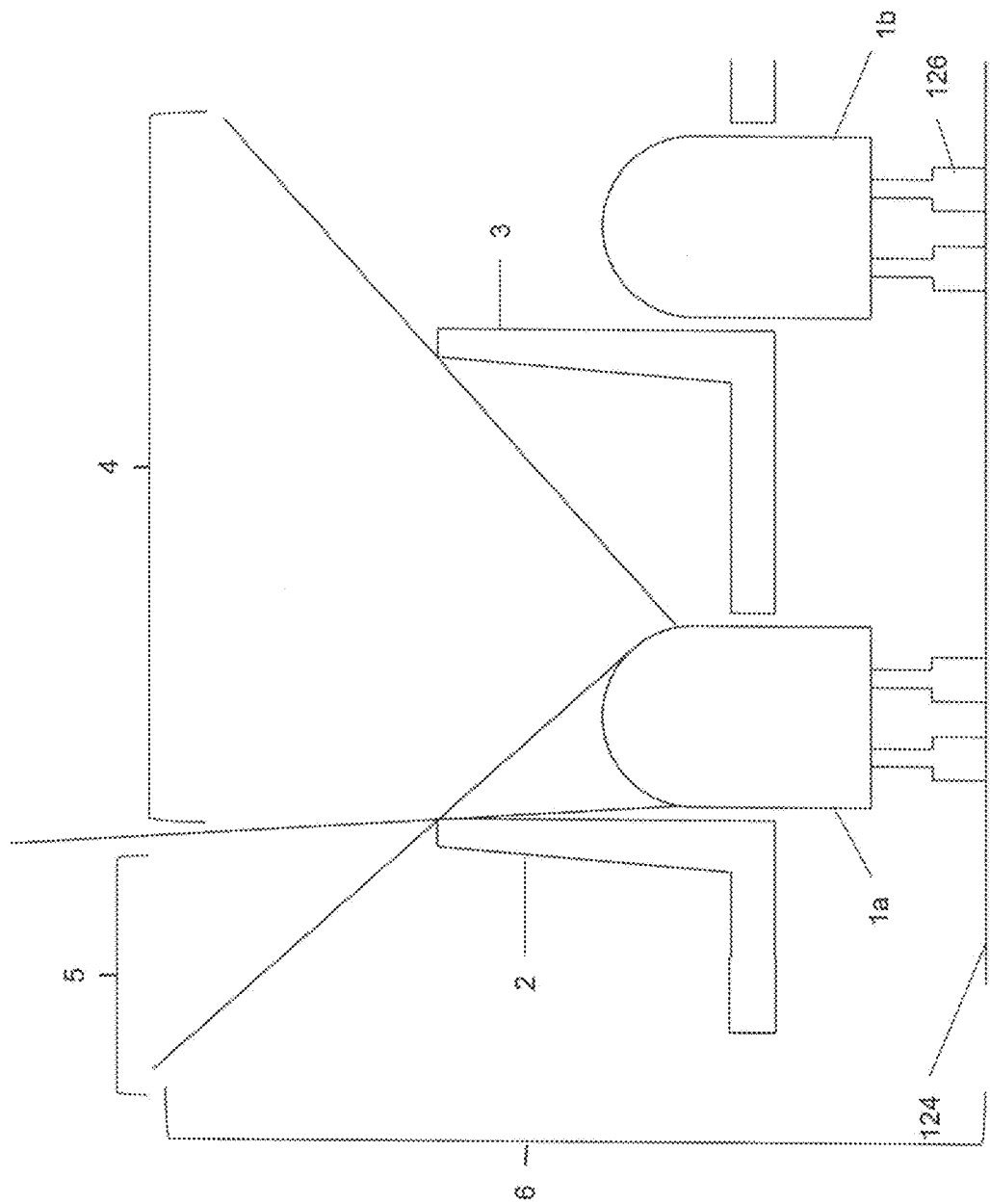
FIG. 1 is a cross-sectional view of a section of a LED light display of an embodiment of the present invention.

In the drawings, embodiments of the invention are illustrated by way of example. It is to be expressly understood that the description and drawings are only for the purpose of illustration and as an aid to understanding, and are not intended as a definition of the limits of the invention.

DETAILED DESCRIPTION OF THE PREFERRED EMBODIMENT

The present invention is an optical LED light display incorporating one or more louvers operable to limit the light emission in a specified direction from a LED diode within the LED light display, each louvers being positioned in relation to each LED light element in the LED light display. The specified direction of the light emission may be towards a target audience or a target direction. A method of the present invention that may be implemented by a software program processed by computer processors of a computer device, may be operable to enable the design of the LED display louver for installation in a specific area to enable simultaneous elimination of light trespass and preservation of image quality for the target audience. A LED light display can be manufactured, configured and installed in accordance with the method.

The LED light display of the present invention is operable to prevent the light emission into light sensitive areas, while preserving display image quality in the direction of targeted viewing. The one or more louvers of the LED light display are each positioned in relation to one or more LED lights (diodes) in the LED light display. The louver blocks the emission of light from the LED light in one or more directions. The blocking of the light by the louver also defines the direction in which the light emission will be allowed. The blocking of the light by the louver creates separate angle regions from the front and center for the LED light display: for optimal viewing; for light trespass reduction; and an undesirable transition region that is neither good for viewing nor fully protects against light trespass. A method may be operable to optimize the resulting location of such regions in relation to the location and position of a LED light display of a particular configuration in an area. The method is implementable by a software program that incorporates instructions that are processed by processors of a computer device. The method may operable to determine the optimum configuration of the louvers in the LED light display, and installation parameters relating to the LED light display, such as location placement and rotation around a specific installation site. The method may further be operable to provide resulting light impact estimations for presentation to project stakeholders.

LED light display includes LED digital billboards, signs, LED electronic message centers, LED variable message signs, other emissive displays with discrete light emitting components, and other LED display systems comprising modular LED panels. The LED light display may be utilized to display complex and detailed images.

Louvers may be formed of any material that is not translucent and that has heat-resistant qualities and characteristics as required for a particular LED light display configuration. (The level of heat and UV output of a LED light display will depend upon its configuration.) For example, polycarbonates, elastomer, wood, plastic, or any other material may be utilized to form a louver.

The louver configuration of a LED digital display is a mechanical means to control horizontal light trespass and simultaneously preserve image quality for the targeted audience. The system and method of the present invention further aid in the design of the LED digital display to effect a particular light impact, by allowing for analysis, modeling, planning and presentation of a representation of the LED light display within a representation of the installation site. Reports can be generated from the software in a variety of forms. As one example, a report may be generated in the form of light trespass reduction proposal for submission to municipal authorities and/or other stakeholders.

As an example of an embodiment of the present invention, an LED light display to be positioned next to a highway can be configured to direct the light emission from the LED light display to the area of the highway. The software program can be utilized to determine the optimal position of the louvers in the LED light display to block light emission in directions other than the area of the highway. For example, light emission may be blocked from reaching from any residential buildings that are located on the side of the highway near the LED light display. The result is that the LED light display can be utilized to display information to drivers on the highway, but the light will not trespass into the residential buildings located near the highway. The benefit of the present invention in this example is that the occupants of the residential buildings will not be subject to any significant light trespass, and as a result the LED display is far more likely to be approved for installation in this location.

A skilled reader will recognize that there are potentially many types of communities and environments that may be positioned close to a LED light display (or a proposed location for a LED light display) from which light trespass should be eliminated or diminished. For example, office buildings, residential communities, airports, rail corridors, wildlife environments, and other areas that have inhabitants or environments that may find light from an LED light display unwanted or harmful, may benefit from the present invention that will block light emission from a nearby LED light display from reaching such inhabitants or environments.

The term "blocking elements" may be utilized herein to reference any type of louver, including reflection minimization louvers, or other blocking elements.

The term "LED light display" may be utilized herein to reference a physical display, whereas the term "LED light display unit" may be utilized herein to reference a representation of a LED light display that can be utilized by the method, computer program and/or system of embodiments of the present invention.

The terms "LED diode", "LED light" may be utilized interchangeably herein to reference any individual element that is operable to emit light. The term "LED module" represents a planar unit comprising an array of LED diodes. Multiple LED modules may be integrated into a LED light display.

The terms "computer program" and "computer software" may be utilized interchangeably herein to reference a set of commands programmed in a computer language that can be stored in any medium, including hard drive storage, a portable storage device, a server, or any other type of storage. The commands can be executed by a microprocessor of a computing device to produce the processing and outputs described herein. The computer program may be operated by the system of the present invention. The computer program may be utilized to implement the method of the present invention or a portion thereof.

Any reference herein to "sensitive communities" or "sensitive areas" is a reference to communities, whether structures or people, sensitive to light trespass. Areas or communities that are light sensitive may include but are not limited to areas of traffic signaling, railway right of ways, airports, residential areas, nature preservation areas, or any other area deemed to be negatively impacted by unnecessary light emission or information transmitted from the LED digital display.

The present invention, and in particular the LED light display is configured to incorporate multiple louvers each being associated with an LED diode of the LED light display. The louvers and LED diodes are further configured to achieve interactions between the louvers and one or more LED lights, whereby the louver blocks light directly from a LED diode, or blocks the reflection of light from a LED diode.

Furthermore, the present invention is operable to be configured such that the louvers and LED diodes generate an image display that can be viewed within a specific viewing area, as discussed herein. The configuration of the LED light display of the present invention is arranged to achieve optimum image quality of the image displayed by the LED light display within a defined viewing area wherein members of a target audience will view the LED light display. Therefore, the configuration of the LED light display is arranged to achieve optimum outputs, including image uniformity, resolution, colour accuracy, pixel fill-ratio, chromatic aberration, contrast considerations, lack of visual artefacts, as well as other outputs.

In this manner the present invention differs from other prior art light displays that incorporate blocking elements. An example of such a prior art light display is a stop light that incorporates light elements having blocking elements positioned in proximity thereto. Such prior art merely utilizes blocking elements to block light from a light in a particular direction. This blocking is insular and related to the blocking element blocking light from a single light. Generally, such prior art further does not display images, such as advertising images. In particular, the prior art does not achieve the output of an image of high quality and resolution directed towards a target audience, as is achieved by embodiments of the present invention. Therefore, as discussed herein, the configuration of the LED diodes and louvers of the present invention, and the output thereof, differ significantly from the prior art.

The method, computer software, and the system of the present invention are operable to achieve planning and approval-seeking in advance of deploying any LED light display. The planning can involve determining the options as to the direction(s) in which light may be emitted from the LED light display in accordance with the position of the LED light display and the configuration of the louvers within the LED light display. This planning can assist an operator of an LED light display to determine where and how to position the LED light display in relation to a target and to areas sensitive to light trespass, as well as how to configure the louvers within the LED light display. The result is a LED light display that is configured and positioned to achieve site-specific objectives for the direction of light from an LED light display towards a target and to eliminate or diminish light emission in the direction of areas, including areas sensitive to light trespass.

The louvers of the present invention may be configured to incorporate blocking elements that restrict the emission of light from a LED diode. These blocking elements can eliminate or diminish the LED module output in unwanted directions for reduction of light trespass.

The computer software and system of the present invention may incorporate modelling tools. The modelling tools may be applied to planning an installation site for an LED light display, prior to the production of the LED light display and/or prior to the installation of the LED light display. The modelling tool can assist an installer and/or operator of a LED light display to determine the scope of the emission of light from a LED light display situated in a particular position that incorporates specific types of louvers, as well as the areas where light will be blocked from emission or where light transmission would be diminished.

The present invention involves a method for using a specialized blocking element (i.e., a louver) that restricts the view angle in a horizontal direction from an LED lighting display. The express goal of the present invention, and the incorporation of louvers in relation to LED diodes in the LED lighting display, is to remove light output in specific directions. A further goal of the present invention is to provide planning method and a software/visualization tool to assist a digital display operator in determining the best position of a LED lighting display to direct the light emission from the display thereof to the intended audience and to visualize this to the operator such that the LED light display unit shown can be rotated by degrees by the user to show the effect of such positioning of the LED light display that will occur at a specific installation location.

As each installation location may have specific features that will affect the positioning of a LED light display, the computer software and system allows for modelling of the installation location and various possible positions of the LED light display therein. In particular the location of the LED light display and the position of the LED light display in that location can be modeled. For example, the LED light display can be positioned to various angles at a particular location in the modeling process. As another example, the configuration of the combination of LED diodes and louvers within the LED light display can be modeled, and this can include pixel arrangement as well as louver configuration (i.e., different types of louvers will have different effects therefore the configuration of the LED light display to incorporate a particular type of louver can affect the LED light display function and effect upon the target viewing area and surrounding areas). The goal is to achieve maximum forward viewing image quality and scope for the target viewing audience, as well as minimal light trespass into light sensitive areas.

The modelling allows for a determination as to the expected the light emission, diminished emission and/or blocked emission as will be experienced by members of a target audience or other inhabitants or elements at selectable locations in the vicinity of the potential installation site of a LED light display. Generally, the best or preferred installation site and best or preferred installation position for the LED light display will achieve the goals of the display, for example, such as making the LED light display visible to the widest amount of the target audience without affecting image quality, while diminishing or blocking light emission to certain areas, including light trespass sensitive areas. Tools in the software enable estimates of the final light impact in the sensitive areas.

In one embodiment of the present invention, the louver may incorporate fins configured to achieve a view angle restriction. For example, such a fin may be a blocking fin positioned immediately horizontally adjacent to a LED diode in the LED light display. As another example, the blocking element may also comprise a fin, ridge, cup, or physical louver parts thereof configured to achieve a view angle restriction via physical blocking.

The louver and any view angle restriction elements will be configured so as to not, or to not substantially, block light output in a forward direction from the LED diode. The louver and any view angle restriction element configured therein will be positioned and designed to preserve a range of angles at which the LED light display may be viewed by a member of a target audience (in an area where the target audience is to be positioned), this is referred to as the "optimal viewing region". Outside of the optimal viewing region the louvers, and any view angle restriction element configured therein, will begin to obstruct light off to the side of the LED diode. The percentage of the light observable from the LED diode diminishes as the LED diode within the LED light display is increasingly covered by the blocking element when the LED light display is viewed from angles outside of the target viewing area and the optimal viewing region.

The target viewing area will be the area where the most members of the target viewing audience are expected to be located and the target audience will view the LED light display at a minimal viewing angle. The boundaries and scope of this area will depend on the LED light display configuration, the determined target audience area and aspects of the installation site. For example, a member of the target audience viewing the LED light display from a position that is directly in front of the LED light display will have a viewing angle that is 0 degrees or slightly more than 0 degrees. A target audience may also view the LED light display for a position that is off center in either a left or right direction. The exact range of viewing angles that will be within the optimal viewing region will depend on the LED light display configuration, the determined target audience area and aspects of the installation site. Therefore, the target viewing area, the optimal viewing region and the range of viewing angles within the optimal viewing region may differ for various LED light displays.

As a person views the LED light display and as the view angle is increased, due to the louvers there is a gradual reduction of the light level across the entire LED light display. This is a combination of effects of increasing blockage of individual LED elements, but also due to the differences in view angles with respect to different areas on the display. As the view angle from the center increases the light emission may still occur and be visible, but less emission will occur and be visible than occurs and is visible within the optimal viewing region, and furthermore the image is made non-uniform. This range of viewing angles is referred to herein as the "transition region". The LED light display will not be as clearly visible in the transition region as it is in the optimal viewing region. For example, in the transition region, information displayed on the LED light display may become non-uniform, full of visual artefacts and not representative of the intended creative content of the image. Therefore, due to the degraded visual quality of the display, this region is to be avoided such that the normal target audience, for example those driving on a highway, do not, or only minimally, pass through this region. The light emission will increasingly diminish as a viewer moves within the transition region from a position that is closer to the optimal viewing region to a position that is farther away from the optimal viewing region. The exact range of viewing angles that will be within the transition region will depend on the LED light display louver configuration.

At a wide enough horizontal angle, and outside of the edge of the transition region that is farthest away from the optimal viewing region, extremely weak or no light emission from the LED light display will occur and be visible. This is known as the "light trespass region". In the light trespass region the LED light display light emission will be only vaguely visible or will not be visible, and therefore any content of the LED light display will only be weakly visible or will not be visible and generally not discernable. As an example, in one installation site the light trespass region may occur at 30 degrees off center of the LED light display. A skilled reader will recognize that the angles from the center of the LED light display that exist within the light trespass region will depend on the LED light display louver configuration. In the light trespass region the majority of the LED diode is shielded by the blocking element and the light output (i.e., light emission) is reduced drastically and in some instance eliminated outright. As an example, in one tested embodiment of the present invention, this reduction is greater than ninety-nine percent (>99%) with some light leakage remaining due to a side reflection (indirect path) off the next adjacent blocking element. The range of angles within the light trespass region will vary for LED light displays and will depend upon aspects of the LED light displays (i.e., aspects of the configuration of the LED light displays) such as pixel pattern, pixel spacing, blocking element material, blocking element configuration, and design, as well as aspects of the installation site, such as sun direction, topographical features, structures, natural elements, etc.

Embodiments of the present invention may provide computer software operable on the system of the present invention to provide visualization tools to aid the LED light display operator in evaluating: (a) whether a LED light display incorporating the louvers to block and diminish light emission in the particular directions from an LED diode is viable for a specific installation site: (b) the proper degree of rotation or azimuth (i.e., positioning) to achieve quality imaging from the LED light display as perceived by a target audience in a target audience area, and light trespass mitigation for light trespass sensitive areas outside of the target audience area, (c) output of information relating to the configuration of louvers in a LED light display and/or the positioning of a LED light display in a specific installation site provided as graphical and/or text format (and such information may be presented and submitted to third parties, such as decision-makers, for example to aid the determination as to whether such an LED light display should be allowed to be built and installed at the installation site), and (d) any calculations and quantifications of any light maps produced by the method, computer software and/or system relating to (c) and any illuminance numbers therein relating to the area of the installation site.

This computer software and system of the present invention may comprise a variety of elements and may display the information produced in a variety of formats. For example, in one embodiment of the present invention the information produced incorporates the following elements: an interactive satellite image or overhead view map of the area of the installation site; a diagrammatical representation of the blocking element "regions" (i.e., optimal viewing region, transition region, and light trespass region—shown as a light map); controls for positioning and rotating a representation of the LED light display within the displayed image or map of the installation site; controls for other parameters relating to the LED light display configuration within the installation site, such as active display size and luminance settings; and parameters relating to output estimations.

Collectively the elements that comprise the computer software and system of the present invention provide tools whereby a particular installation site may be depicted to a user, such as on a screen of a computing device, that may be any of a laptop, a desktop computer, or any mobile device, such as a cell phone, a smart phone, a tablet, or any other mobile device. The user may utilize the visualization tools of the system to position a representation of a LED light display within the installation site. This step may involve the user identifying the target audience and the area where the target audience is expected to be located (the target audience area) within the installation site and positioning the LED light display to face the target audience. For example, the target audience may be identified as drivers on a highway, and a particular stretch of the highway may be chosen as the target audience area. The user may position the LED light display to face the target audience area. As another example, a target audience may be identified as persons in the vicinity of a downtown square or a park, and a particular area within the downtown square or the park may be choses as the target audience area. The use may position the LED light display to face the target audience area. A skilled reader will recognize that a variety of target audiences may be chosen in a variety of different areas.

A louver configuration of the LED light display may be chosen by the user. The louver configuration will determine the portion of the LED diodes in the LED light display from which light is blocked by a louver. This chosen louver configuration will therefore determine the light emission occurring from the LED light display.

In one embodiment the present invention, the system will process one or more aspects of the installation site (e.g., buildings, structures, roadways, trees, topographical features, and other aspects) to determine the optimal viewing region, transition region and light trespass region based upon the expected light emission from the LED light display in accordance with the louver configuration. Other embodiments of the present invention may not process any aspects of the installation site to determine the optimal viewing region, transition region and light trespass region and may solely base the identification of the regions upon the expected light emission from the LED light display in accordance with the louver configuration.

If the regions do not correspond with the LED light display requirements, or the requirements of the environment surrounding the LED light display, a user may utilize the visualization tools to alter the position of the LED light display. For example, the visualization tools may be utilized to move the representation of the LED light display to a different location within the installation site depiction, or to rotate the position of the LED light display (i.e., rotating the LED light display representation to the right or to the left from its original position). The visualization tools may further be utilized to alter the configuration of the louvers within the LED light display in relation to the LED diodes therein. For example, such as configuring the louvers to block more or less of the light emission from the diodes, which can be achieved by changing the size and/or shape of the louvers, as discussed herein. Upon such alterations of location, position and/or louver configuration of a LED light display, the system will produce results that show the optimal viewing region, the transition region and the light trespass region relating to the new location, position and/or configuration of the louvers of the LED light display.

As an example, for a LED light display located near a highway, the position and/or louver configuration of such LED light display may be required to be set in accordance with optimum viewing of the information (e.g., image) of the display by the largest possible target audience of drivers on the highway, while restricting or diminishing light trespass to residential community housing, parks or other areas (including light sensitive areas) beside the highway. Use of the visualization tools can assist a user to determine how the LED light display should be located, configured and positioned within a particular installation site to meet the greatest number of the requirements and optimize tradeoffs between image viewing (such as viewing of billboard advertising) value and minimized local light impact for nearby communities and areas. This can aid a user in obtaining approvals needed to install a LED light display in an area that may have otherwise not have been obtained. A report can be generated through the method, system and/or software, that can be utilized for the purpose of presentation to an approval body (such as municipal decision-makers) to provide a visual representation of a LED light display installed in a particular area, and to thereby generate an understanding of the light impact of such installation by the approval body members.

As another example, a LED light display located in a downtown locale that incorporates shopping, business and residential buildings may need to be positioned to provide information displayed upon such display clearly to people in an area of the street, while simultaneously avoiding light trespass, or diminishing light trespass, for the residential or business buildings in the area. Use of the visualization tools can assist a user to determine how the LED light display should be located, configured and positioned within that particular installation site to meet the greatest number of the requirements for such LED light display in the installation site (e.g., information transmission to the target audience, and light emission diminishment or blocking for the environment where the target audience is not located, etc.).

The present invention may have several embodiments. These embodiments provide particular benefits over the prior art. The LED light display of the present invention, and the method, software and/or system operable to create, locate, configure and/or position a LED light display of the present invention, achieve the following outcomes that the prior art is incapable of achieving: (i) minimizing light trespass into areas to address light trespass requirements of light sensitive areas located near such LED displays; (ii) and addressing the increasing effort by local approval bodies (e.g., governments, regulatory organizations, etc.) to regulate and restrict the installations of such LED displays; (iii) blocking light emission in directions that require protection, while preserving the quality of the information (e.g., image) displayed on the LED light display in the direction of the intended audience (e.g., the target audience); (iv) reducing light trespass in the horizontal directions in LED light displays, while simultaneously achieving (and not compromising) the industry gold standard in optical performance as experienced by the intended target audience; (v) functioning with Dual Inline Pin (DIP) oval LEDs; and (vi) not interfering with the standard and optimized optical performance of the LED elements in the LED light display due to the modification of the light output in the intended target audience view direction, and due to the full blocking of direct light output in the light trespass direction (i.e., instead of merely reducing it).

As an example, the present invention can address the increasing community backlash regarding aesthetics, traffic impacts and light impact or light trespass caused by prior art LED light displays. By blocking or diminishing light emission from LED diodes (and the LED light display generally) in particular directions and/or at particular viewing angles, only the target audience segment located near a LED light display receives the effects of the direct light emission from the LED light display. Therefore, members of the community may be near a LED light display, but if they are located in a transition region or a light trespass region they will receive either minimal effect or no effect of light emission from the LED light display.

Another example of a benefit of the present invention over the prior art is that existing prior art outdoor LED light displays, by virtue of their wide angles and their design goal of reaching a maximum audience, create significant light trespass as a matter of course. Display operators of prior art displays often attempt to reduce the light trespass by slightly turning the face of a LED light display away (by, as an example, approximately 5-30 degrees) from any light sensitive communities. However, this activity is insufficient as the Full Width at Half Maximum (FWHM) angle for these displays ranges from approximately 90 degrees to 110 degrees. The outcome is that only a very small reduction of light can be achieved by turning the face of the prior art LED light display slightly away from light sensitive communities. In addition, decision-makers in the approval process rarely have a full understanding of lighting impact and often err on the conservative side (i.e., rejecting applications) as they have no quantifiable support for a quantification of light impact generated by a proposed project.

The present invention seeks to solve these problems by use of specially designed louvers positioned in relation to LED diodes in the LED light display, and the LED pixel pattern of the LED light display. The present invention also acts to solve these problems through the application of a method, a system and/or a computer software program operable to adjust installation parameters of the displays in situ and to quantitatively estimate the light impact thereof in the surrounding environment. These elements of the present invention can produce the following outcomes: a) the LED light display is operable to render excellent quality images to an audience who are directly facing the LED light display, or who are positioned at a minimal angle from the center of the LED light display (either to the right or the left of the center), said minimal angle generally being a narrow angle; and b) the LED light display reduces the light trespass significantly (for example, such as by approximately 99% or a greater percentage) at a side angle beyond the minimal angle (e.g., the side angle being either within the transition region or the light trespass region) where there may be a light sensitive area or community.

A skilled reader will recognize that embodiments of the present invention offer other benefits over the prior art.

The discussion below provides information about some embodiments of the present invention. A skilled reader will recognize that this discussion provides examples of possible embodiments of the present invention, and that other embodiments of the present invention are also possible.

As shown in FIG. 1, each LED diode within a LED light display is connected, for example, such as by soldering or another connection, to a printed circuit board (PCB). As an example, LED diode 1b incorporated within a LED light display will be stood off from the PCB 124 via one or more pin standoffs 126. The LED diodes and PCB constitute the display unit that is operable to emit light that is visible to a viewer as information or an image. As discussed herein blocking elements may further be incorporated in the display unit.

The display unit may be is connected to one or more supporting elements. When the LED light display is installed in an installation site one or more of the supporting elements may be in contact with the ground, or a portion of one or more of the supporting elements may be embedded in the ground. The supporting elements will support the display unit in a position above the ground.

The display unit of the present invention may incorporate blocking elements. An example of such blocking elements are shown in FIG. 1. The LED diodes 1a and 1b further each have one or more louvers (i.e., blocking elements) positioned in proximity thereto. For example, LED diode 1a has louver 2 positioned proximate thereto and LED diode 1b has louver 3 positioned proximate thereto. (LED diode 2 has louvers 2 and 3 proximate thereto.) Louver 2 blocks a portion of the light emission from diode 1a, and louver 3 blocks a portion of the light emission from diode 1b. Louvers 2 and 3 as shown are two possible embodiments of a mechanical blocking element incorporated in a LED light display of the present invention. A skilled reader will recognize that other configurations of blocking elements are possible, such as semi-circular cups, multi-segmented louvers, or blocking elements of any other shape that creates a blocking effect for a portion of the light emission from a LED diode positioned proximate to the blocking element.

Figure 3:
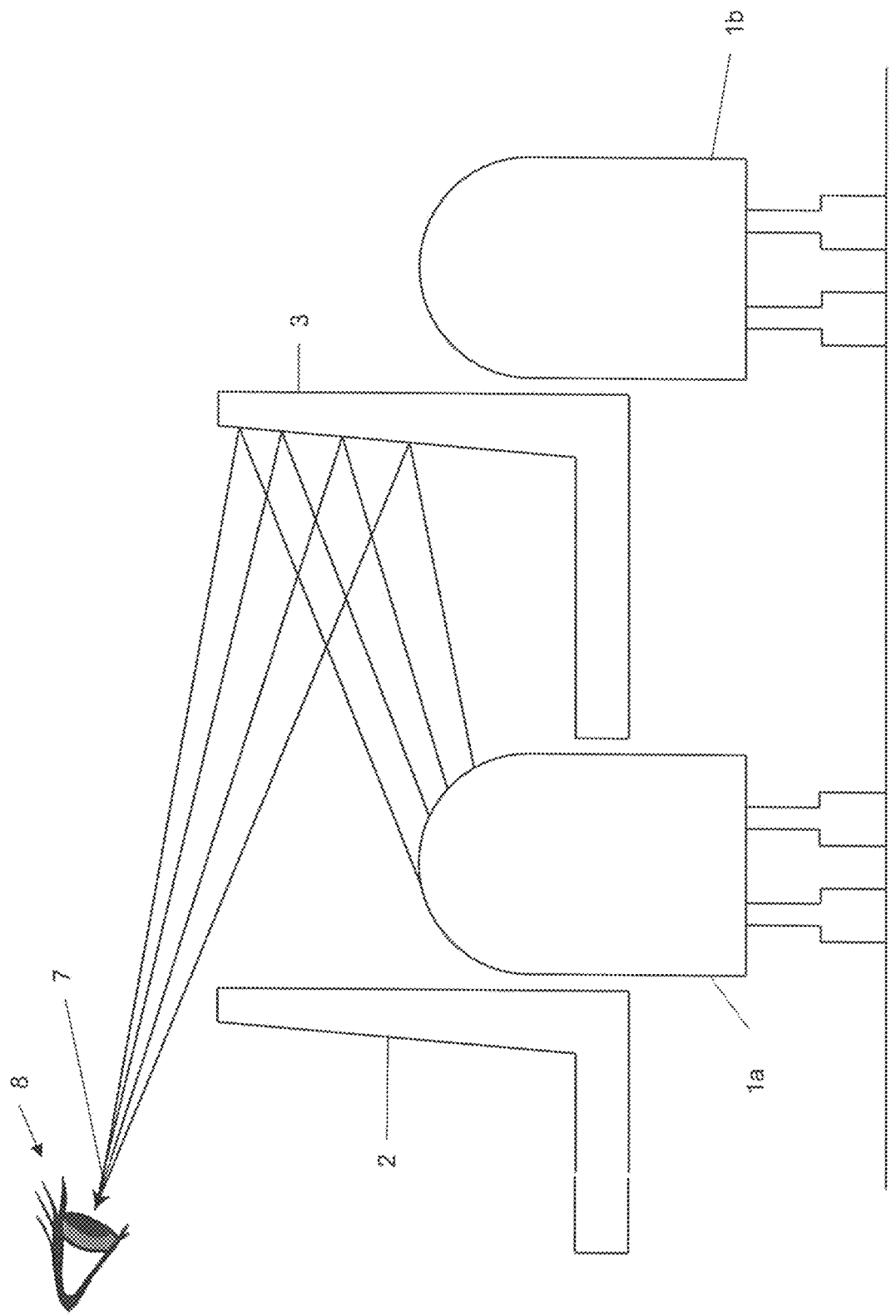
FIG. 3 is a cross-sectional view of a section of a LED light display of an embodiment of the present invention showing reflections arriving at a viewer in the protected region.

A variety of types of blocking elements may be incorporated in a LED light display of an embodiment of the present invention (as shown in FIG. 3), or a single type of blocking element may be incorporated in a LED light display of another embodiment of the present invention (as shown in FIG. 1).

FIG. 1, in particular, depicts combinations of LED diodes and corresponding blocking elements that result in particular viewing angle regions.

The entire surface of a LED diode emits light since the body of the diode acts as a lens that encloses a light emitting diode die. The present invention separates the forward viewing arcs from the LED diodes in a LED light display into three distinct regions. The diode optimal viewing region 4 is the region in which there is no obstruction of any light emission from any part of the surface of the LED diode 1a. The diode optimal viewing region is a viewing arc that is not affected by the louvers 2 or 3. The collective area of the diode optimal viewing regions, for all of the LED diodes of the LED light display, represent the optimal viewing region for the LED light display. When the LED light display is viewed by a viewer from an angle within the optimal viewing region, the highest image, or information, display quality that the LED light display is capable of achieving, will be perceived by the viewer.

The diode transition region 5 is an area wherein part of the surface of LED diode 1a is exposed to view. In the diode transition region the light emission from the LED diode is partially blocked. As the viewing angle increases within the diode transition region for LED diode 1a, from the greatest angle of the diode optimal viewing region 4 to the smallest angle of the diode light trespass region 5, the portion of the light emission from LED 1a that is blocked from view increases and the light emission output reaching the viewer decreases. Collectively the diode transition regions of all of the LED diodes of the LED light display represent that transition region for the LED light display.

The transition region should be minimized in the design of LED light display of embodiments of the present invention. The reason for this goal is twofold: (a) because the image quality produced to be viewed by a viewer in the transition region is insufficient for clear viewing, and (b) the transition region is not protected fully from unwanted light trespass. In relation to (a), the target audience for a LED light display will not be able to clearly view the information provided on the display from a position within the transition region. The clarity and quality of the display information, which is not optimal anywhere in the transition region, will decrease as the viewer moves within the transition region away from the optimal viewing region and towards the light trespass region. The method, system and/or computer program of the present invention may be operable to address the goal of minimizing the size and range of angles within the transition region by aiding the user to select application parameters for the configuration and position of the LED light display within an installation site to best produce a transition region that is as small as possible, or positioned such that neither the target audience nor the protected audience are located in the region.

The LED diode light trespass region 6 is a viewing arc in which all of the possible direct lines of sight to the LED diode 1a are covered by the louver 2. This region is a protected region, wherein protection is provided from light trespass. In particular, the protected region is advantageous to light sensitive persons or structures in the vicinity of the LED light display, as light emission from LED diode 1a is blocked from reaching the diode light trespass region. Collectively the diode light trespass regions for all LED diodes in the LED light display constitute the light trespass region for the LED light display. Within the light trespass region light emission from the LED light display will be diminished or eradicated. (Within portions of the light trespass region that are closest to the transition region the light emission from the LED light display may be diminished. As a viewer moves farther away from the LED light display within the transition region the light emission may be eradicated.) The limitation that prevents eradication is that indirect reflections may occur on the adjacent louver.

Figure 2C:
FIG. 2c is a perspective view of a LED light display of an embodiment of the present invention viewed from a greater side angle than shown in FIG. 2b.
Figure 2B:
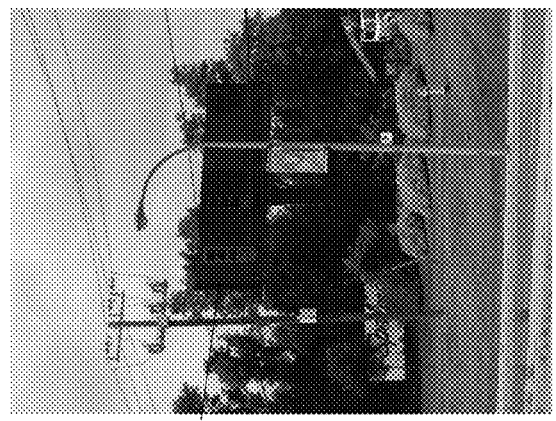
FIG. 2b is a perspective view of a LED light display of an embodiment of the present invention viewed from a side angle.
Figure 2A:
FIG. 2a is a perspective view of a LED light display of an embodiment of the present invention viewed from the front.

As shown in FIGS. 2a-2c, the portion of the LED light display that is visible, and the amount of light that is emitted towards a viewer of the LED light display alters based on the position of the viewer in relation to the LED light display. For example, as shown in FIG. 2a, if the viewer is directly in front of the LED light display 50 (i.e., positioned at an approximately 0 degree angle to the LED light display), the information displayed on the display will be clearly visible and full light emission will be directed towards the viewer. The viewer is in the optimal viewing region in this example.

As yet another example, as shown in FIG. 2b, if the viewer is viewing the LED light display 50 from an angle from the center of the display that is sufficient for at least a portion of the light emission of the LED diodes to fail to reach the viewer (i.e., positioned at an approximately 20-30 degree angle from the center of the LED light display), the information displayed on the display is not clearly visible to the viewer. At such a position a portion of the light emission from the LED diodes is blocked from the viewer's view by blocking elements, each blocking element being positioned proximate to at least one LED diode. Therefore, only a portion of the light emission from the LED diodes reaches the viewer. The viewer is within the transition region in this example.

As yet another example, as shown in FIG. 2c, if the viewer is viewing the LED light display 50 from an angle from the center of the display that is sufficient for possibly no light emission of the LED diodes or minimal light emission to reach the viewer (i.e., positioned at an angle that is approximately greater than 30 degrees from the center of the LED light display), the information displayed on the display may not be visible to the viewer. At such a position of the viewer the light emission from the LED diodes may be fully or near-fully blocked by blocking elements, each blocking element being positioned proximate to at least one LED diode. It is possible that some reflected light emission may reach the viewer at this angle. The viewer is within the light trespass region in this example.

The surface of a LED light display will incorporate an array of individual LED diodes and associated blocking elements. In such a configuration, some reflection of light will inevitably occur. An example of such reflection of light is shown in FIG. 3, wherein reflection 7 occurs whereby at least a portion of the light emitted from a LED diode 1*a* is directed to louver 3 and is reflected off louver 3 to the eye 8 of a viewer of the LED light display. The viewer may be within the diode light trespass region relating to LED diode 1*a*. The result is that even though light emitted from LED diode 1*a* is blocked from reaching the light trespass region 6 (in particular the light emitted in the direction of louver 2 is so blocked), some of the light emitted from LED diode 1*a* in the direction of louver 3 is reflected off of louver 3 into the light trespass region. This limits the ultimate light trespass reduction to approximately 99% within areas of the light trespass region where such reflected light emission reaches.

Therefore, as discussed herein, light emission may not be fully eradicated within all areas within the light trespass region, due to the fact that although light emission directly directed towards the light trespass region may be blocked by a louver, some reflected light emission may reach areas of the light trespass region. However, as only reflected light emission from a portion of the LED diode may reach the light trespass region, the light emission experienced in the light trespass region is significantly diminished, so as to be nearly eradicated, as compared to the light emission occurring in the same area proximate to a prior art system. This is because the prior art system does not include any blocking element to block any light emitted from the LED diodes of a LED light display from reaching any region in relation to the LED light display, as may occur due to direct light emission and/or due to scattering of light caused by airborne particles or moisture such as fog. Thus, FIG. 3, in particular, shows the combination of LED diodes and corresponding blocking elements, and the effects thereof upon reflections, that have one form of blocking performance.

Embodiments of the present invention may incorporate louvers that are reflection minimization louvers. A reflection minimization louver may be configured to block light emission from a portion of a LED diode and to also block the majority of the reflection of light emission that may occur off of a portion of a louver. A reflection minimization louver may affect the light emission from multiple LED diodes. For example, a reflection minimization louver may block light emission from a portion of a first LED diode and block the majority of the reflection of light emission from a second LED diode. Without such blocking the reflection of light emission from the second LED diode could otherwise be emitted to a viewer from the reflection of light from a LED diode off of a portion of the reflection minimization louver.

Figure 4:
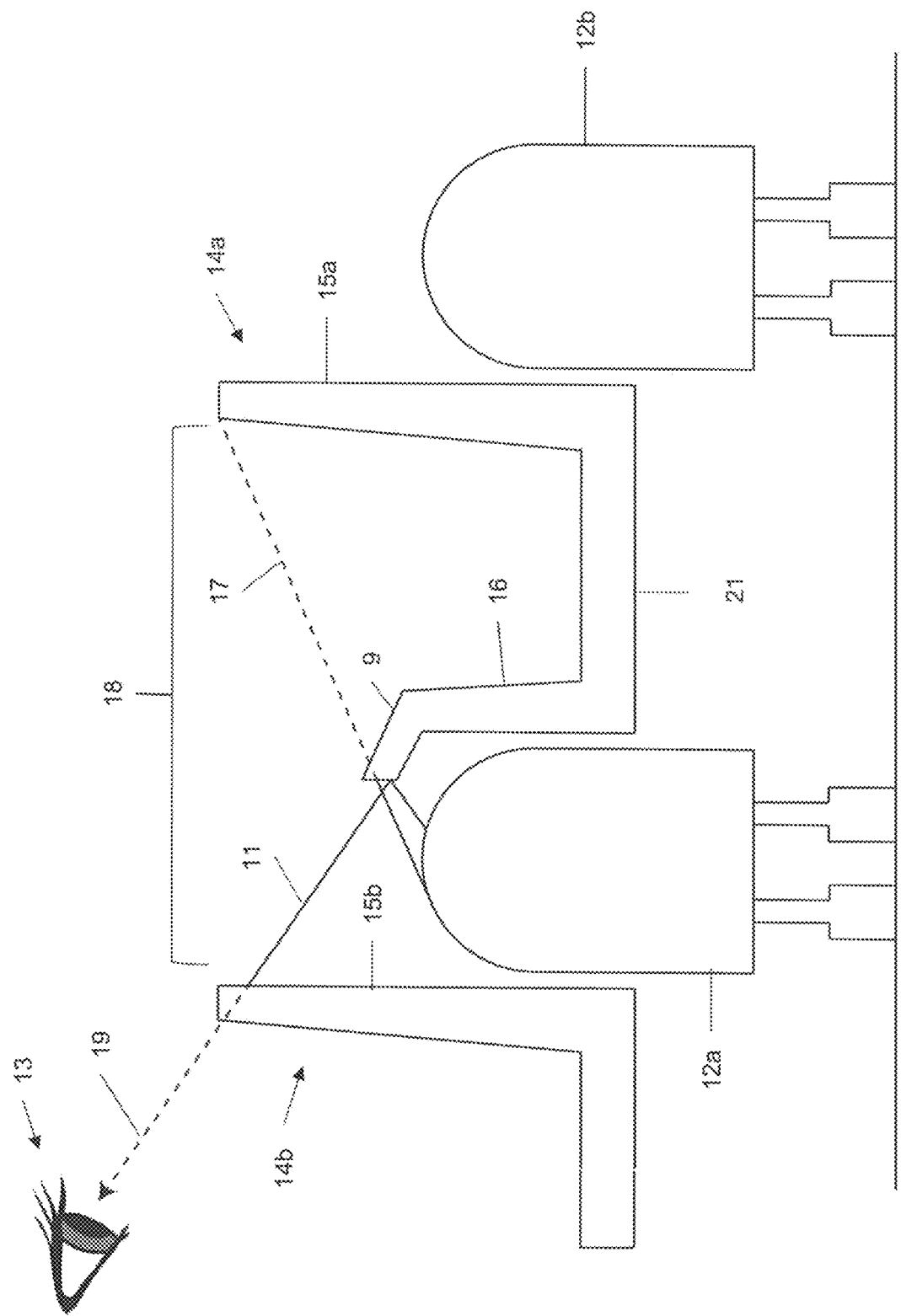
FIG. 4 is a cross-sectional view of a section of a LED light display of an embodiment of the present invention incorporating reflection minimization louvers.

An example of a reflection minimization louver is shown in FIG. 4. A reflection minimization louver 14 may be positioned between and proximate to two LED diodes 12*a* and 12*b*. The reflection minimization louver may incorporate a light emission blocking arm 15 that is operable to block a portion of the light emitted from LED diode 12*b*. The reflection minimization louver may further incorporate an arm 16 proximate to LED diode 12*a* that incorporates a reflection blocking flange 9 that is configured to be angled in relation to the arm 16 and the LED diode 12*a*. The angle of the reflection blocking flange is configured to minimize the amount of reflection 11 of light emitted from LED diode 12*a* off of the arm 16 or off of the reflection blocking flange 9. The reflection blocking flange is further configured to block light that would otherwise reflect off of the light emission blocking arm, as is shown as blocked reflected light path 17.

The light emission blocking arm 15*b* of a reflection minimization louver 14*b* may further be configured so as to block reflected light 11 that is reflected off of the reflection blocking flange 9 of another reflection minimization louver 14*a*. The light emission blocking arm thus blocks the reflected light 11 that would otherwise be viewable by a viewer 13 who is within the light trespass region, as is shown by blocked viewable reflected light path 19. Therefore, the configuration of a reflection minimization louver can be designed to block light emitted directly from a LED diode proximate to the reflection blocking flange, as well as to block light reflected from the reflection blocking flange of another reflection minimization louver.

Arm 16 and light emission blocking arm 15*a* of a reflection minimization louver may be attached by a connection section 21. A skilled reader will recognize that the connection section may be of any size and configuration, such as a point of intersection of the arms within a U-shaped or V-shaped connection, a straight section extending between the arm and the light emission blocking arm, or any other type of size and configuration that connects the arm to the light emission blocking arm. In some embodiments of the present invention, a reflection minimization louver may be configured to minimize the amount of light that is emitted from a LED diode and reflected off a portion of a louver that is visible to a viewer within the transition region.

The reflection blocking flange of a reflection minimization louver and its configuration is a key feature of some embodiments of the present invention. The reflection blocking flange acts as a reflection reduction element, and is formed to function by providing angled coverage of a portion of a LED diode. The reflection minimization louver can minimize the area of reflective surface of the reflection minimization louver wherefrom reflections can be reflected and thereby become viewable by a viewer in a transition region and/or a light trespass region. Such an area of reflective surface is a direct reflection area 10. The reflection minimization louver can further block the path of light reflected off of another reflection minimization louver from becoming viewable by a viewer in a transition region and/or a light trespass region. Such an area of the surface of a reflection minimization louver that blocks such reflected light is a reflected light area 18.

The parameters of the design, and the configuration, of a reflection minimization louver must balance reflection mitigation and loss of imaging fidelity. The configuration, design and/or positioning of a reflection minimization louver within a LED light display may cause a portion of the LED diode light emission to be blocked from being viewed by viewers within the optimal viewing region.

In embodiments of the present invention that incorporate any form of blocking element, from a position that is directly in front of a LED diode, the emission of light and distribution of such emitted light from the LED diode originates primarily from the center of the surface of the LED diode, and not from the periphery of the surface of the LED diode. Most LED diodes, especially those in a Dual Inline Pin (DIP) package (such as is popular for outdoor applications), have a LED body that acts as a lens so that light originates primarily from the center of the lens and not from the periphery of the lens. Therefore, partial cover of the peripheral surface of the LED diode caused by the reflection block flange may not significantly reduce the forward light output, though it can effectively shrink the optimum viewing region. Embodiments of the present invention can incorporate DIPs, whereas other embodiments of the present invention may not incorporate DIPs.

Generally, reflection minimization louvers may be incorporated in a LED light display to minimize viewable reflection of light emitted from a LED diode off of a portion of a louver, and further to improve the light trespass region blocking performance. With reflection minimization in place, the blocking performance exceeds performance of a prior art LED display that does not have any blocking elements or other forms of blockers, for example. Embodiments of the present invention can achieve a blocking performance of up to a magnitude of, or exceeding 99.9%, in the light trespass region. The result is that embodiments of the present invention can fully or near-fully remove all visibility of the information presented on the LED light display.

The capability of the present invention to block light in the light trespass region offers benefits over the prior art. As one example, at a railway right of way it may be a requirement that the LED light display be unable to present information in the direction of the train tracks that could be mistaken for railway signaling lights by a train conductor. A prior art LED light display positioned near a railway right of way that does not incorporate the blocking louvers and/or the reflection minimization louvers of embodiments of the present invention may emit a faint image in the light trespass region (in the direction of the railway track), and therefore may not meet the requirements for a LED light display near a railway right of way. An embodiment of the present invention may be configured such that the LED light display may incorporate a combination of louvers and reflection minimization louvers.

A skilled reader will recognize that an embodiment of the present invention may further incorporate solely blocking elements that are not reflection minimization louvers, or may incorporate only blocking elements that are reflection minimization louvers, or a combination of multiple types of blocking elements. A skilled reader will recognize that another embodiment of the present invention may incorporate solely reflection minimization louvers and not include louvers.

A variety of layouts and configurations of blocking elements and LED diodes are possible in embodiments of the present invention. Such layouts and configurations represent LED pixel layout patterns. The one or more layouts and configurations of LED pixel layout patterns incorporated in a LED light display may be chosen based upon the optimality thereof for use with the present invention, in accordance with the goals and requirements of embodiments of the present invention. Such goals and requirements of embodiments of the present invention may be related to aspects of the installation site where the LED light display is to be located, and other aspects relating to the target audience, and any light sensitivities of structures, people or areas in the installation site, as discussed herein.

Within a full color LED light display, multiple primary color LED diodes or multiple dies within one single LED diode may be combined in each pixel to render the full color spectrum. There are many design considerations dictating the LED light display pixel layout to be incorporated in a LED light display. LED light display pixel layouts can trade off various visual qualities. The blocking louver implications of pixel layouts are discussed below, although there are other qualities and design considerations relating to pixel layouts that may also be considered when choosing a pixel layout (or multiple pixel layouts) to be incorporated in a LED light display.

Some examples of possible layouts and configurations of blocking elements and LED diodes that may be incorporated in LED light displays of embodiments of the present invention are shown in FIGS. 5a-5f. Layouts 5a-5c represent some LED pixel layouts that can be used in LED light displays of embodiments of the present invention, while layouts 5d-5f represent layouts that are optimal for LED light display embodiments of the present invention. A skilled reader will recognize that other layouts and configurations are also possible for embodiments of the present invention. A skilled reader will also recognize that combinations of two or more of the layouts and configurations shown as patterns in FIGS. 5a-5f can be included in a single LED light display, or a single pattern can be included in a LED light display.

A pixel layout pattern may comprise multiple LED diodes and blocking elements arranged in particular positions in relation to each other. Example patterns are shown in FIGS. 5a-5f. Generally, FIG. 5a shows a pixel layout pattern incorporating blocking elements to the left of a LED diode, and such blocking element may further possibly be to the right of another LED diode. FIGS. 5b-5c each show a pixel layout pattern incorporating blocking elements to the left of a LED diode, and such blocking element may further possibly be to the right of another LED diode. Thus, FIGS. 5b-5c show asymmetric blocking for left side of a LED diode, and possibly to the right side of another LED diode. FIGS. 5d-5f each show an optimized pixel layout pattern incorporating blocking elements.

As shown in FIG. 5a, a group of six LED diodes 20a-20f and corresponding blocking elements 22a-22f, respectively, may be arranged in a first arrangement pattern 24. Multiple repeats of the pattern shown in FIG. 4a may be incorporated in a LED light display. The pattern specifically incorporates two blocking elements 22a and 22b each being positioned to the left side of a LED diode 20a and 20b, respectively, and a single blocking element 22c being positioned to the left side of a LED diode 22c, said blocking element 22c and LED diode 20c being positioned directly below the LED diode 22a and blocking element 22b, and LED diodes 20a and 20b configured to be centered in relation to said upper configuration (the "upper FIG. 5a grouping"). A grouping of blocking elements 22d-22f are positioned in relation to LED diodes 20d-20f, respectively, and this grouping (the "lower FIG. 5a grouping") is positioned directly below the upper FIG. 5a grouping. The position of the blocking elements and LED diodes in the lower FIG. 5a grouping are inverted from that shown in the upper FIG. 5a grouping, such that the blocking elements 22d-22f are positioned to the right side of the LED diodes 20d-20f.

The pattern shown in FIG. 5a may not be optimal for some embodiments of the present invention due to the positioning of the blocking elements. Namely, the middle blocking element 22c may: (a) unnecessarily restrict the viewing angle of the adjacent LED; and (b) create a relatively high reflection. The net result is that one color in the LED light display will have a narrower view angle than other colours, and simultaneously will not be properly blocked in the light trespass region.

Another example pixel layout pattern is shown in FIG. 5b that is vertically asymmetric. This example incorporates a group of six LED diodes 20a-20f and corresponding blocking elements 22a-22f, respectively, arranged in a first vertical arrangement pattern. Multiple repeats of the pattern shown in FIG. 5b may be incorporated in a LED light display. Blocking element 22a is positioned to the left side of LED diode 20a. Blocking element 22b is positioned directly below LED diode 20a, and blocking element 22b is positioned to the left side of LED diode 20b. LED diode 20c is positioned directly below blocking element 22b and blocking element 22c is to the left side of the LED diode 20c. The arrangement of the LED diodes 20a-20c in relation to blocking elements 22a-22c is the "upper FIG. 5b grouping". A grouping of blocking elements 22d-22f are positioned in relation to LED diodes 20d-20f, respectively, and this grouping (the "lower FIG. 5b grouping") is positioned directly below the upper FIG. 5b grouping. The position of the blocking elements and LED diodes in the lower FIG. 5b grouping are inverted from that shown in the upper FIG. 5a grouping, such that the blocking elements 22d-22f are positioned to the right side of the LED diodes 20d-20f. However, LED diode 20e is positioned to be directly below blocking element 22d and directly above blocking element 22f.

The pixel layout pattern shown in FIG. 5b is arranged such that left and right blocking has different properties, and may produce a lower image quality when the digital display is viewed from a downward or upward angle, owing to the interference of blocking louvers immediately below the LED diodes.

Another example pixel layout pattern is shown in FIG. 5c that is vertically asymmetric. This example is a group of six LED diodes 20a-20f and corresponding blocking elements 22a-22f, each combination of blocking element and diode is positioned exactly opposite to the pattern shown in FIG. 5b to form a second vertical arrangement pattern. Multiple repeats of the pattern shown in FIG. 5c may be incorporated in a LED light display. The pattern shown in FIG. 5c may be preferable for some embodiments of the present invention over the pattern shown in FIG. 5b, but the pattern of FIG. 5c may not be optimal for some embodiments of the present invention.

Another example pixel layout pattern is shown in FIG. 5d that is vertically symmetric. This example pattern incorporates a group of three LED diodes 20a-20c and corresponding blocking elements 22a-22c, respectively. Each blocking element is positioned to the left side of the LED diode and blocking element 22a and LED diode 20a are positioned above blocking element 22b and LED diode 20b. Blocking element 22c and LED diode 20c are positioned directly below blocking element 22b and LED diode 20b. All of the LED diodes are vertically arranged and all of the blocking elements are vertically aligned, to form a third vertical arrangement pattern. Multiple repeats of the pattern shown in FIG. 5d may be incorporated in a LED light display.

Another example pixel layout pattern is shown in FIG. 5e that is vertically asymmetric. This example pattern incorporates a group of four LED diodes 20a-20d and corresponding blocking elements 22a-22d, respectively. Each blocking element is positioned to the left side of the LED diode, and blocking element 22a and LED diode 20a are positioned above blocking elements 22b-22c and LED diodes 20b-20c that are positioned side-by-side. The combination of blocking element 22a and LED diode 20a are centered above the combination of blocking elements 22b-22c and LED diodes 20b-20c. Blocking element 22d and LED diode 20d are positioned below blocking elements 22b-22c and LED diodes 20b-20c, in vertical alignment with blocking element 22a and LED diode 20a. The entire pattern in FIG. 5e may be mirrored horizontally to provide blocking in the opposite direction. This arrangement forms a second arrangement pattern. Multiple repeats of the pattern shown in FIG. 5e may be incorporated in a LED light display.

Another example pixel layout pattern is shown in FIG. 5f that is vertically symmetric. This example pattern incorporates a group of four LED diodes 20a-20d and corresponding blocking elements 22a-22d, respectively. Each blocking element is positioned to the left side of the LED diode, and blocking elements 22a-22b and LED diodes 20a-20b are positioned beside each other. Directly below blocking elements 22b-22c and LED diodes 20b-20c are positioned beside each other such that blocking elements 20a-2b are vertically aligned with blocking elements 20c-20d, respectively, and LED diodes 20a-20b are vertically aligned with LED diodes 20c-20d, respectively. The entire pattern in FIG. 5f may be mirrored horizontally to provide blocking in the opposite direction. This arrangement forms a fourth vertical arrangement pattern. Multiple repeats of the pattern shown in FIG. 5f may be incorporated in a LED light display.

The patterns shown in FIGS. 5d-5f are considered optimized patterns for blocking louver application in some embodiments of the present invention. The patterns shown in FIGS. 5d-5f may share the following properties: (a) horizontal symmetry; (b) minimized interference between blocking elements and LED diodes for which it is not the main blocker; and (c) identical placement of one or more blocking elements in relation to each individual LED diode.

Any one of, or a collection of, the patterns shown in FIGS. 5a-5f can be incorporated in embodiments of the present invention. Each pattern incorporated in embodiments of the present invention may include blocking elements of different shapes and forms. As one example, a blocking element may be shaped and formed as a rounded cup shape. The shape and form of a blocking elements is configured to provide mechanical blocking of individual LED diodes to achieve control light trespass from a LED diode, and a multiple blocking elements and LED diodes can control light trespass from an LED light display generally.

Embodiments of the present invention may further incorporate a method that may be performed by a system and/or computer program, operable to aid LED light display operators and designers in planning, analyzing and presenting the lighting impact of a LED light display with respect to an area surrounding said LED light display within an installation site. As discussed herein, LED light display may be of various forms and types, including a digital billboard, a digital installation, or other LED displays.

Figure 6:
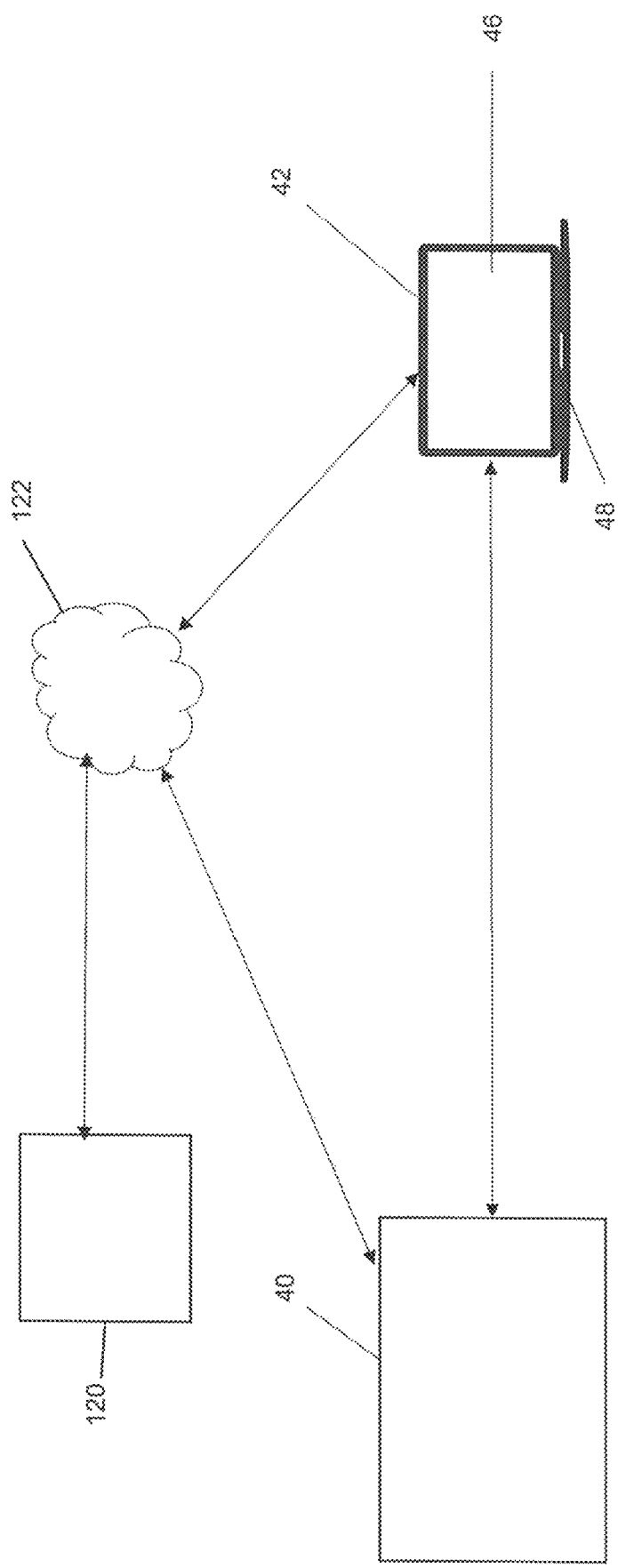
FIG. 6 is a systems diagram of the system of an embodiment of the present invention.

As shown in FIG. 6 a system of an embodiment of the present invention may incorporate a storage element 40 operable to communicate bi-directionally with a computing device 46. The storage element may be a server, a cloud server, a hard drive, memory incorporated in a computing device, or any other one or more elements operable to store method instructions and/or information, for example, such as computer program instructions and/or information. The computing device may be any of a laptop, a desktop computer, or any mobile device, such as a cell phone, a smart phone, a tablet, or any other mobile device. The computing device may incorporate a display and an input element or may be connected (through hardwiring or a wireless connection) to the display and the input element. The user may utilize the input element 48 to provide information to the computing device. The input element may be a keyboard, a touchscreen, a voice command processor, or any other type of input element whereby a user can input information to be provided to the computing device and utilized by the processor therein in accordance with the method (such as may be provided as computer program instructions).

The method steps, commands, operations and/or instructions, that may be in the form of a computer program, may be stored on one of the one or more the storage elements and be processed such that the steps, commands, operations and/or instructions of the method may be executed by the computing device by at least one processor (e.g., central processing unit, microprocessor, etc.) incorporated in the computing the device. The processor is operable to recognize the method steps, commands, operation and/or instructions and to implement the functions and execute the method steps, commands, operation and/or instructions.

The one or more storage elements are connected to the computing device, and the processor accesses information stored in the one or more storage elements and the store information in the one or more storage elements in accordance with the computer program commands (that relate to the method).

The computing device may generate information or reports in accordance with the method. The information and/or reports can be transferred from the computing device to a computer system 120 of a third party either directly or via an Internet connection 122. The computer system of the third party may be a computing device, a server, a networked computer system, or any other form of computer system, including a cloud based computer system.

As an example, a report that is in a form that provides information regarding the suggested location, positioning and configuration for a proposed LED light display, may be transferred either directly or via an Internet connection to a regulatory body, such as a municipal authority, or another organization, for review and approval. The computer system of the present invention may be operable to prepare the form in the format required by such third party regulatory body. A skilled reader will recognize that there are many other reasons why information or report(s) may be generated by the computer system and transferred to a third party and that embodiments of the present invention may be operable to support such information and/or report(s).

Any approval or information relating to the information or report received may be transferred from the third party computer system 120 to the computing device 42 or the server 40 of the present invention via an Internet connection, or directly. The information received may be utilized by the user of the computing device and/or the computer program. For example, received information may be acceptance of the form sent to a regulatory body, or information about further adjustments to the location, position and/or configuration of the LED lighting display that are required by the regulatory body. A skilled reader will recognize the variety of types of information that may be transferred by a third party to either the computing device and/or the server of the present invention, either directly or via an Internet connection.

A skilled reader will further recognize that the computing device 42 may be operable with cloud storage, such that the server 40 may be accessed by the computing device via a cloud-based connection.

Figure 7:
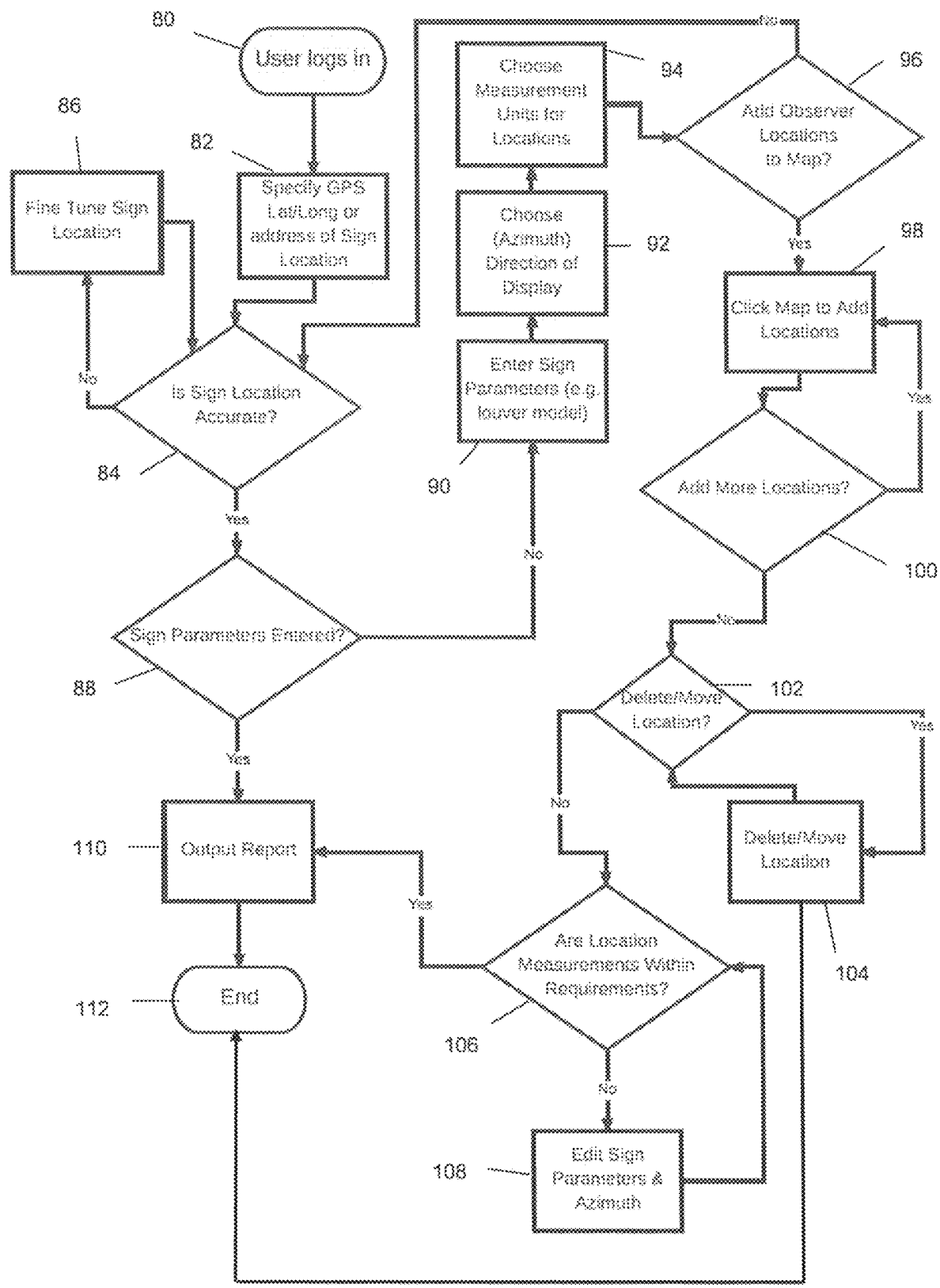
FIG. 7 is a flowchart of the steps of the method of one embodiment of the present invention.

A skilled reader will recognize that there are a variety of possible steps that may be incorporated in the method of the present invention (that may be implemented by processing of a computer program, or the function of the system of the present invention). One example of a set of steps that may comprise the method of the present invention (and as may be performed by a computer program and/or utilized by the system) is shown at FIG. 7. In accordance with this example, a user of the system may login to a computer program, as shown as step 80. For example, the user may login to the computer program, and the computer system whereby the computer program operability is accessible, by providing login information that is reviewed against stored login records to confirm the authorization of the user to login to the computer program. Alternatively, a user may not be required to login to the computer program prior to utilizing the computer program.

As shown at step 82, a user may enter a GPS location coordinate or an address of a location (e.g., latitude and longitude, or a physical address), to indicate where the LED light display unit is to be located. The GPS coordinates or the location address provided to the system by a user will indicate the pinpoint location of the LED light display unit. A map of the location surrounding the provided coordinates or location address will be shown to the user on the display of the computing device whereby the user is accessing and utilizing the system. The scale of the map shown to the user may be set by the user, and in some embodiments of the present invention the user may zoom in or zoom out on the map to show less or more of the area surrounding the coordinates or location address provided to the system. The LED light display unit will be shown as located within the map at the location of the coordinates or the location address.

As shown in step 84 a user may be required to indicate whether the location of the LED light display unit within the map is correct. If the user indicates that the location of the LED light display unit within the map is not correct the location of the LED light display unit within the map may be altered at step 86. For example, the LED light display unit may be relocated by the user within the map to a new location (e.g., for example, by the user dragging the LED light display unit to a new location within the map, or the user indicating another coordinate or another location address), or the LED light display unit may be repositioned by the user within the map to a new position (e.g., for example, by the user rotating or otherwise altering the position of the LED light display unit at the location indicated by the coordinates or location address provided by the user to the system).

If the LED light display unit is repositioned or relocated within the map, step 84 will be repeated. Steps 84 and 86 may be repeated until the user indicates at step 84 that the LED light display unit is correctly located at step 84. Upon the instance that the user indicates that the LED light display unit is correctly located at step 84, the system will proceed to step 88. At step 88 the system will undertake a review to determine if the parameters relating to the LED light display unit are entered. If the parameters are entered and this is verified by the system (e.g., verification that all required parameters are entered and/or that parameters entered are within any recognized requirements for a location), the system will proceed to step 110.

At step 88, if the system determines that the parameters are not entered, the user will be able to input parameters for the configuration of the LED light display unit. For example, some examples of input parameters include display model, orientation, night brightness, display size (width and length), direction of face (azimuth), the louver model, and/or other parameters. Generally such parameters include requirements for engineering and building the LED light display. The parameters may be selected by the user from a list of parameter options, or may be entered by the user. Moreover, some embodiments of the present invention may indicate and require that some parameters must be provided by a user for the system to function, whereas some other parameters may be optionally provided by a user.

In some embodiments of the present invention, the system may recognize specific requirements for a location, such as bylaw requirements, municipal requirements, or other requirements related to signs, lighting and/or LED light displays that may affect the position, configuration and/or location of an LED light display within the coordinates or location address where the LED light display unit is located and positioned within the map by the user. Such embodiments of the present invention may offer parameters to the user in accordance with such requirements, or may provide feedback to a user if a parameter is provide that is not consistent with such requirements, such as an indicated parameter for night brightness that is outside of the parameters for night brightness that such requirements permit.

In embodiments of the present invention, system specific prompts for one or more particular parameters to be entered by the user may be provided to the user. For example, at step 90 a user may be prompted to enter the model, style, shape and/or type of louver that is to be incorporated in the LED light display unit. At step 92 a user may be prompted to choose an (azimuth) direction of the LED light display unit. At step 94 a user may be prompted to enter measurement units for the location of the LED light display unit (e.g., width in feet or meters and/or length in feet or meters, or other units of measurement).

A user may add observer locations to the map displayed to the user on the display that is attached to the computing device that the user is utilizing to access the system, at step 96. Alternatively, some embodiments of the present invention may recognize observer locations and may automatically show these in the map displayed to the user. (Examples of observer locations indicated in a map shown to a user are indicated as observer locations 70a and 70b in FIG. 8.) The observer locations indicate areas that are light sensitive, or that have other requirements that relate to the positioning of a LED light display unit.

If the user does not choose to add observer locations, and there are no observer locations already displayed on the map, then the system may return to step 84. Otherwise, if a user chooses to add observer locations, the system progresses to step 98.

At step 98 a user may add an observer location to the map, for example, such as clicking on the map, through use of a mouse or a touchscreen, to indicate where an observer location should be added to the map. The user may further add an observer location, or provide additional information relating to an observer location the user has added to the map, by providing information relevant to an observer location, such as the feet that the observer location is to be from the LED light display unit, the illuminance unit of the illuminance that observer location requires, and the assumed usage information relating to the observer location. At step 100 a user may choose to add an additional observer location, and steps 98 and 100 may be repeated until a user chooses not to add any observer locations at step 100.

The system may process the observer locations shown on the map (at step 88 if observer locations are included in the map that were not entered by a user and/or at step 102 if the user adds one or more observer locations to the map). Such processing of the system may generate information relating to the one or more observer locations, including the distance of the observer location from the LED light display unit in the map and the illuminance unit and assumed usage relating to the display from the LED light display unit that will affect the location of the observer location. (As an example, a measurement such as foot candles may be utilized to indicate the brightness of any light from the LED light display unit that will affect an observer location.) The system and/or the user may review the processing results relating to the effect of the LED light display unit upon the observer location to determine if such effect is within the requirements of such observer location. For example, will the brightness of the light from the LED light display unit that will affect the observer location be brighter than the light tolerance of the observer location (e.g., determined in relation to the light sensitivity of the observer location).

A user can choose to delete the location of the LED light display unit from the map, or may decide to move the location of the LED light display unit within the map (in accordance with the discussion herein regarding relocating the LED light display unit within the map). For example, based upon the analysis by the system regarding the brightness of the light from the LED light display unit that will reach an observer location and the determination by the user and/or the system that such brightness exceeds the light tolerance of the observer location, the user may decide to delete or move the LED light display unit within the map.

If the user chooses to delete or move the location of the LED light display unit within the map, the deletion or relocation of the LED light display unit will be achieved at step 104. If the LED light display unit is deleted from the map the user may choose to exit the program, or the user may decide to delete the LED light display unit from the map and to enter information to position a new LED light display unit in the map. If the LED light display unit is deleted and another LED light display unit is not added to the map, the method may process to the end step 112 and exit.

If the user decides to move the LED light display unit in the map, or to delete the LED light display unit from the map and add another LED light display unit in the map, steps 102 and 104 may be repeated until the LED light display unit is positioned within the map at a location that the user determines to be acceptable to continue the method of the system.

The system will generate location measurements for the LED light display unit within the map based upon the location and position of any moved LED light display unit, or the location and position of any newly added LED light display unit. At step 106 the system will review and analyze such location measurements to determine whether such location measurements are within any requirements for such measurements that the system recognizes. Such requirements for measurements may include recognized bylaw, municipal or other set requirements relating to a community or area upon the map, requirements for observer locations (e.g., brightness tolerances, etc.), or any other requirements relating to the location measurements. If the processing by the system and/or any review by the user indicates that the location measurements are not within requirements, then the system proceeds to step 108 and the parameters for the LED light display unit, including azimuth, may be reentered or otherwise amended by the user (such as in accordance with a process that is the same or similar to the process discussed for steps 88-104).

The system may generate a light map that may be overlaid upon the map display. The light map may indicate the areas of light emission to a viewer, such as by showing the optimal viewing area, the transition area and the light trespass region in relation to a LED light display. Each region may be indicated in a different colour of shading, by different fill-in markings, such as lines, stipple, clear, and/or by other markings. When the light map is overlaid upon the map, such that the light map is positioned in relation to the LED light display unit on the map, and the combination of the map with the light may positioned as overlaid thereon is displayed to a user, the three regions are visible in relation to the LED light display unit. A depiction of such a display of the map and the light map overlay thereupon can be captured in a report that may be provided to a third party by the system and/or the user.

Once the processing by the system and/or any review by the user indicates that the location measurements are within requirements, then the system proceeds to step 110. The system will process the LED light display unit location and position indicated in the map, as well as other information related to the location and position of the LED light display unit on the map and the effect of the LED light display, as discussed herein, and will generate an assessment of such position and location. Output of the assessment will be provided at step 110, as a report.

After a report is generated (and potentially transmitted to a third party) the method may proceed to the end step 112 and exit the method and/or program.

In some embodiments of the present invention, one or more LED light display units may be positioned upon the map and the steps of the method may be performed in relation to each LED light display unit. The map may therefore may one or more light maps overlaid thereupon, and a user and/or the method can assess the effect of the one or more LED light display units upon areas within the map, including light sensitive areas.

In some embodiments of the present invention the topography or elements such as structures, trees or other elements of the location shown in the map may be displayed to a user, and in some embodiments of the present invention such topography or elements may be taken into consideration in the assessment of the method and/or of the user.

The modifications to the LED light display unit location, configuration and/or position, other outputs and/or assessment results of the method may be displayed to the user and/or may be provided as a report that can be printed or can be transferred to a third party. The report may be in any format and may include various combinations of information regarding the location and position of the LED light display unit and the effect of the LED light display unit (as discussed herein).

The report may be in a format that can be provided to a stakeholder, such as a regulatory authority, an engineer, a LED light display installation manager, or any other stakeholder. The report may be provided in a format that is consistent with the layout of a form whereby submissions are permitted to be delivered to such stakeholder.

In some embodiments of the present invention, the report may be in the format of a form required to request authorization to install a LED light display in the location, configuration and position indicated by the user to the system in accordance with the method. In such an embodiment, the system may be configured to permit a user to transfer the form to the third party that is the authorization body, board or organization that must review and approve the form in order for permission to be granted for an LED light display to be installed in a particular location and position, upon the user's approval for such a transfer. The authorization body may further provide their response (i.e., approval, refusal, comments, etc.) based upon the form to the user via the system.

The present invention may further incorporate a report that is formatted to include information to be provided to a party hired to build a LED light display, such as the dimensions of the light display, the pixel arrangement of the light display, the type of louvers to be incorporated in the light display and the arrangement thereof in relation to LED diode(s), and other information regarding the configuration of the light display required to build the light display. Such a report may incorporate a specification for the building of a LED light display. This report may be transferred by the system, upon the user's approval to a third party who is chosen by a user. The third party may send a response to the report to the user via the system.

A skilled reader will recognize the variety of other types of reports and responses that may be generated by the system, sent to a third party by the system, and/or received from a third party by the system. The operability of the system to generate reports that are in the format required by a third party for specific forms of communication with such third party represent a benefit of the present invention as these facilities of the system save the user significant time, cost and/or effort in preparing such third party communication. This method can further protect the chain of custody of the form as it is transferred directly to the third party for review, and as a response thereto is provided directly to the user by the system. Additionally method of the present invention can negate the need for a separate official statement to be prepared to identify the light impact of a LED light display that otherwise is required to be submitted with a LED light display installation site approval application.

The system generally provides a benefit to the user over the prior art in that it allows a user to simulate, model and plan the location and positioning of a LED light display and the effect thereof upon the surrounding area, including light sensitive areas. The parameters of the LED light display (e.g., configuration), the location of the LED light display, and the positioning of the LED light display can be amended and otherwise modified so that multiple configurations of the LED light display, positions of the LED light display, and/or locations of the LED light display can be modeled, to better inform the planning of the LED light display installation.

FIG. 7 shows a particular method of the system of one embodiment of the present invention. A skilled reader will recognize that other embodiments of the present invention that incorporate other methods of the system are also possible. A general discussion of the possible methods of the system follows.

The user may indicate a location for a LED light display unit to be located to the system through the input of elements at an installation site. The system may locate a graphical representation of the installation site, such as a satellite view of the installation site, or an overhead view map of the installation site. In some instances, the user may provide to the system the graphical representation of the installation site to be utilized by system. The user may indicate the intended area where a target audience is expected to be located, within the installation site although this step is not necessarily required. The map or image displayed to a user of the installation site is herein referenced as an installation site, or a representation of the installation site, or an installation site representation.

The user may indicate to the system the type of LED light display unit that is to be utilized by the system and the configuration thereof. For example, the user may indicate the dimensions of the LED light display, the pattern of pixels to be incorporated in the LED light display, combinations of LED diodes and blocking elements relating to said pixels, any use of reflection minimization louvers, and the configuration of the blocking elements and/or reflection minimization louvers. The user may further indicate to the system other parameters relating to the configuration and design of the LED light display that may affect light emission that will reach a viewer at various locations in the area surrounding the display, and the position of the display within the installation site. The parameters of the LED light display unit, the type of unit, and the other information relating to the unit, may be stored in the storage element. A user may select some of this information from pre-populated option lists in some embodiments of the present invention, or may input the information to the system.

The user may indicate the location where the LED light display unit should be located within the depiction of the installation site. Once situated in a particular location the unit can be positioned in that location, such as by being rotated while in the same location. The unit can also be relocated to a different position within the installation site. For example, the user may utilize visualization tools to situate in a location, position, rotate, relocation and/or reposition the LED light display unit within the depiction of the installation site.

Upon a LED light display unit being located and positioned within a depiction of an installation site, a user can choose to generate information relating to the light that will emit from the display unit of that particular configuration, and in that particular location and position. This assessment information will allow a user to determine whether display of the information on the LED light display will be adequately provided to the target audience and/or whether light trespass from the LED light display will reach areas, including any light sensitive communities. The user will be able to determine the optimal or best configuration, location and/or position for the LED light display within the installation site based on the assessment information.

There are a variety of possible presentations and displays for the elements of the system, including assessment information in embodiments of the present invention. The presentation may incorporate a satellite image or a diagrammatical map showing an installation site. The image or map may be selectable from options provided upon the display to a user through user input. The installation site image or map may represent the vicinity of a potential site for installation of the LED light display.

The assessment information may be provided as an overlay diagram for the map or image (i.e., a light map). The overlay diagram may represent the light trespass region, the transition region and the optimal viewing region in relation to the LED light display unit configuration, location and position chosen by a user within the representation of the installation site (i.e., the map or image). Properties of the overlay may change dynamically with the configuration of the LED light display parameters chosen by a user and the location and/or position of the light display unit within the representation of the installation site.

Information entry and/or selection features may be provided to a user for user input relating to the type and parameters of the LED light display unit to be installed at the depicted installation site. For example, such entry or selection may be processed by the computer program and/or system to configure the LED light display unit including parameters such as, light blocking orientation, brightness settings, size, and display azimuth (compass) orientation. In embodiments of the present invention the selection of such parameters may be restricted to only pre-set types of LED light displays, and the selections and entries by a user (i.e., user input) may be reviewed to confirm they represent valid or buildable configurations of LED light displays. Other embodiments of the present invention may permit a user to provide selections and entries that represent any configuration of an LED light display, including a new design for a LED light display. Any selections made may processed by the system to dynamically update the overlay diagram and assessment information.

The display and presentation provided to a user may be developed such that it may be utilized to setup and view the assessment relating to various locations of interest within an installation site. Locations of interest can be selected on the installation site representation marked with a location marker (i.e., an observer location or the marker of a light sensitive structure or area). In some embodiments of the present invention the location marker may be labelled for ease of reference. Location marker parameters can be set-up by a user, or may be hardcoded into the computer program. Such parameters can include the units of measurement to be used to indicate the measurement of light at the location marker or the distance to the location marker from the center of the LED light display unit, and analysis assumptions such as the type of displayed image usage that will occur at the location marker. Selected marker locations can be populated into a list that can dynamically display the analysis measurements, such as distance to center of the display and experienced illumination in measurements such as provided as measurements of lux or foot candles. Reference conditions may be provided and displayed for the purpose of users easily comparing analysis illuminance results to certain reference levels. A location marker may indicate a location in the installation site that has particular requirements, such as a light sensitivity.

The system can incorporate an output module operable to create reports in various formats and including various information relating to the LED light design unit, the installation site, and the assessment of a particular positioning of the LED light design unit with the rendering of the installation site. A report or a portion thereof may be sent by the system directly from the computing device to a recipient, for example, such as by SMS, text message, email, or through any other electronic communication method or process. For example, a report may be sent to a member of the staff of a manufacturer of LED light displays as a step in a review and confirmation process relating to the design, manufacture and/or installation of a LED light display. If review of the report is required the report can be required to be signed and forwarded to one or more persons, such as to the end audience who may include city planners, city council members, by-law enforcement groups, local community advocates, and any other stakeholders in light trespass considerations, required to review a proposed installation of a LED light display prior to installation. As these reports are often kept on record as part of legal requirements for signage permits, provisions such as the manufacturer review process may be included in embodiments of the computer program and/or system of the present invention to ensure accuracy, review and authenticity of such reports.

Figure 8:
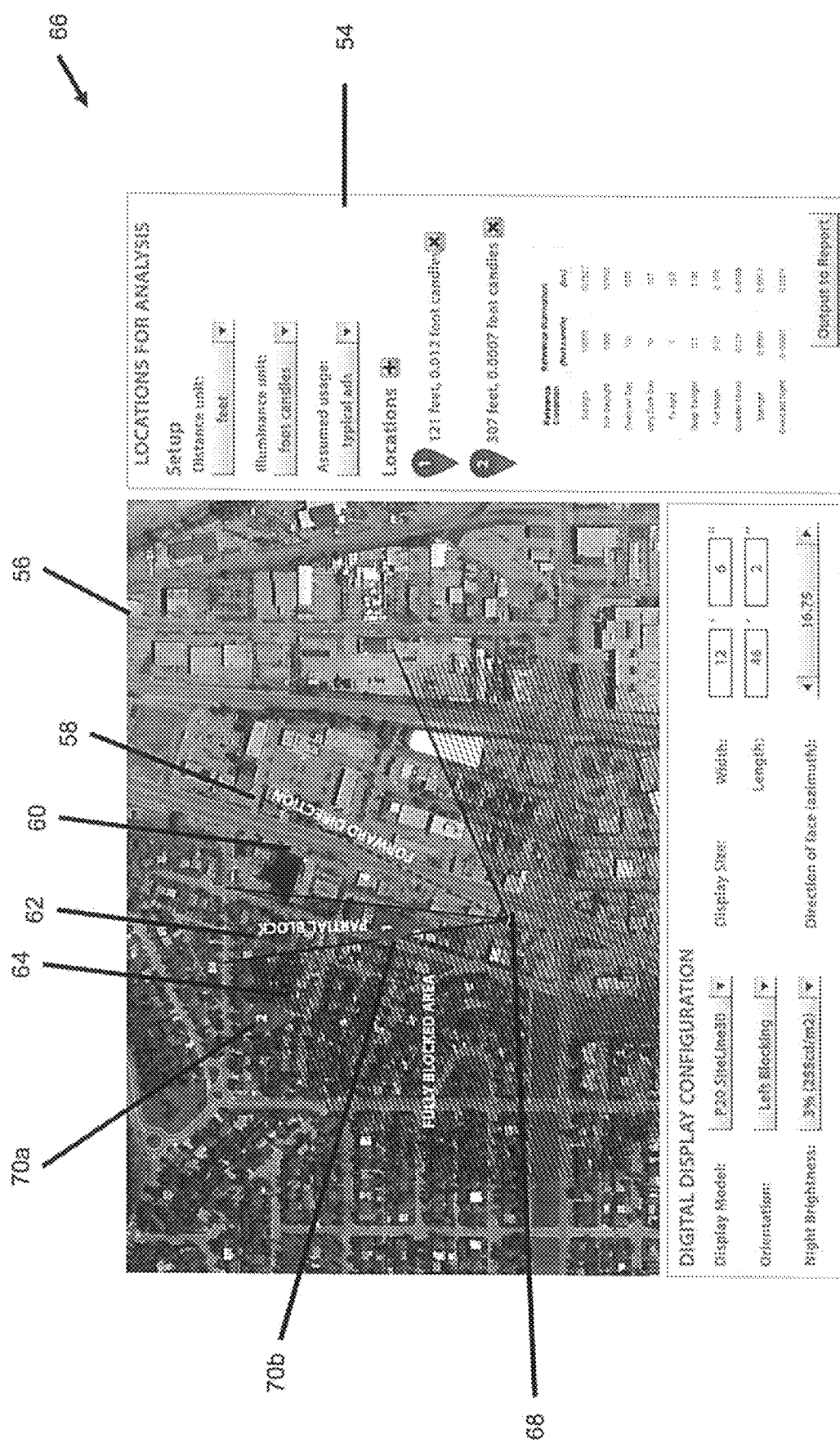
FIG. 8 is a screen shot of an example of information output generated by the computer software and examples of visualization tools that a user can utilize to generate a plan of an embodiment of the present invention for planning the position of a LED light display in relation to LED light display configuration and aspects of an installation site.

The display and presentation of information provided to a user may be similar to the screen 66 shown in FIG. 8. The screen may incorporate a configuration section 52 where information relating to the confirmation of the LED light display unit may be selected or inputted by a user. The screen may further incorporate a location section 54 wherein information relating to assessments of the installation site, such as types of measurement, information about any marker locations, and other reference information relating to the installation site and the use of the LED light display unit within the installation site may be displayed.

The screen may be depicted to show elements within the installation site depiction, such as the position of the LED light display unit 68, and one or more location markers (such as observer locations 70a, 70b). An overlay section 56 may further depict information relating to the assessment information, and may be seamlessly or near-seamlessly overlaid upon the installation site depiction. The overlay may include a forward direction indicator 58 that shows the forward direction from the display. (The forward direction indicator may show a viewer position that is central or near-central to the display, and may indicate a zero degree angle, or a near-zero degree angle, from the center of the display.)

The overlay section may further show in relation to the LED light display unit and aspects of the installation site, a light trespass region indication 64 (i.e., a lined area), a transition region indication 62 (i.e., a dotted area) and an optimal viewing region indication 60 (i.e., a clear area within the circle that is otherwise formed of a combination of the light trespass region, the transition region and the optimal viewing region, although the area of the three regions will not necessarily always be shown as a circular shape).

The integration of the overlay section with the installation site depiction assists a user in recognizing the scope of areas within an installation site that may be affected by light emission, or not affected by light emission, from a specific configured LED light display unit.

Figure 9B:
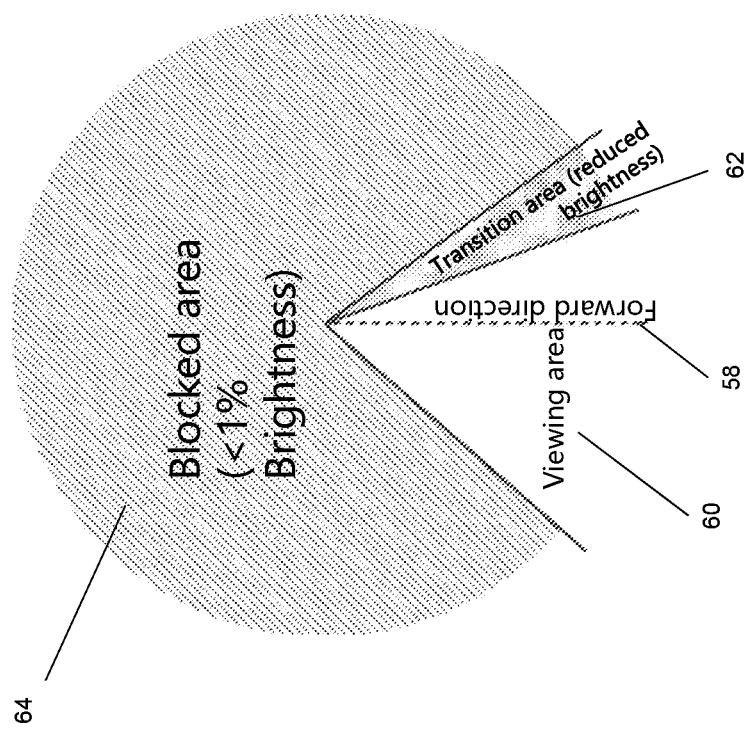
FIG. 9b is a plan showing the light emission area from LED light display of an embodiment of the present invention.
Figure 9A:
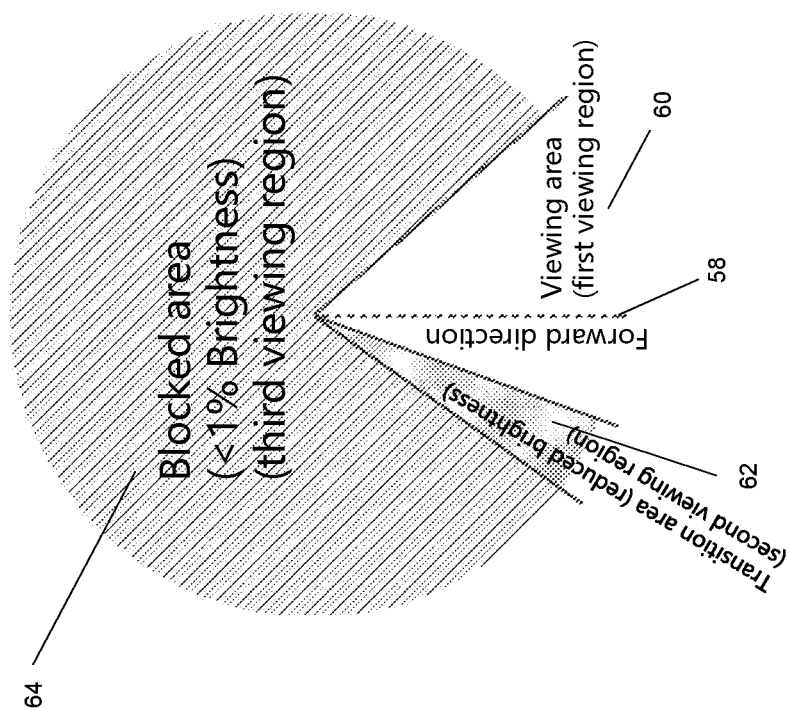
FIG. 9a is a plan showing the light emission area from LED light display of an embodiment of the present invention.

As shown in FIGS. 9a-9b, the position of the block elements within a LED light display will determine whether the transition region will be to the left or the right of the center of the display. FIGS. 9a-9b show an overlay that is not integrated with an installation site depiction. As shown in FIG. 9a, if the blocking elements are positioned to the left of the LED diode corresponding to the blocking element, such that the blocking element is positioned to block light emission from the LED diode that is emitted on the left side of the LED diode, then the transition region 62 will exist to the right of the center of the front of the display. The center of the display is indicated by a forward direction indicator 58. The transition region 62 has an optimal viewing region 60 on its side that is closer to the center of the display, and a light trespass region on the other side.

As shown in FIG. 9b, if the blocking elements are positioned to the right of the LED diode corresponding to the blocking element, such that the blocking element is positioned to block light emission from the LED diode that is emitted on the right side of the LED diode, then the transition region 62 will exist to the left of the center of the front of the display. The center of the display is indicated by a forward direction indicator 58. The transition region 62 has an optimal viewing region 60 on its side that is closer to the center of the display, and a light trespass region on the other side.

In each of FIGS. 9a-9b the light trespass region, and/or areas therein, may experience minimal light emission, for example, such as approximately less than 1 percent of light emission or brightness from the LED light display.

In an embodiment of the present invention, blocking elements and reflection minimization louvers maybe incorporated in the LED light display whereby a transition region is created on both sides of the LED light display (i.e., to the right and to the left of the center of the LED light display). In such an embodiment of the present invention the transition regions may be of equal size (i.e., incorporating the same range of viewing angles to the right and to the left of the center of the display) and equidistant from the center of the display, or the two transitions regions may be of different sizes and positioned at different distances to the left and the right of the center of the LED light display.

It will be appreciated by those skilled in the art that other variations of the embodiments described herein may also be practiced without departing from the scope of the invention. Other modifications are therefore possible.

We claim:

1. A LED light display apparatus operable to control light emission in at least one direction and configured for installation and use in a predetermined upright position at or above eye-level of a viewer, comprising:
   a printed circuit board (PCB);
   one or more LED diodes connected to the PCB;
   one or more blocking elements, each one of the one or more blocking elements in the LED light display apparatus being positioned:
      in sufficient proximity to one of the one or more LED diodes such that said blocking element blocks light emitted from an entire surface of said LED diode excepting light emitted from a side of said LED diode that is opposite to said blocking element; and
      in a vertical arrangement pattern with at least one LED diode; and
   whereby light emitted from the LED light display apparatus when in the predetermined upright position at or above eye-level of a viewer is blocked from visibility by said blocking elements in at least one horizontal direction at varying levels of light emission blocking at a range of horizontal angles from the front of the LED light display apparatus as the viewer moves in front of the LED light display along such horizontal direction, and said light being viewable as one or more images providing information to the viewer in solely the horizontal angles at which light emission is not fully blocked in such at least one horizontal direction directions; and
   whereby light trespass is blocked by the blocking elements at horizontal viewing angles of the LED light display apparatus.

2. The LED light display apparatus of claim 1, further comprising the one or more blocking elements configured to incorporate a section attachable to the PCB, and an arm that extends away from the PCB in the same direction as the one or more LED diodes extend away from the PCB, said arm being operable to block the light from at least a portion of the LED diode it is proximate to in the direction that the light is emitted from the LED diode towards the arm of the blocking element.

3. The LED light display apparatus of claim 2, further comprising the arm of the blocking element being any of the following shapes or configurations: flat sided, semi-circular cupped, or multi-segmented.

4. The LED light display apparatus of claim 2, further comprising any of the following elements configured to block light emission from the LED diode that the blocking element is positioned proximate to: a fin, a ridge, and a cup.

5. The LED light display apparatus of claim 1, further comprising three or more viewing regions in the area surrounding the LED light display apparatus when in the predetermined upright position at or above eye-level of the viewer, including at least the following:
   a first viewing region that is in front of the LED light display apparatus and within a range of angles from the front of the LED light display apparatus wherein light emission from the LED light display apparatus is visible by a viewer;
   a second viewing region that is within a range of angles from the front of the LED light display apparatus that is farther from the front of LED light display apparatus than the first viewing region, wherein light emission from the LED light display apparatus is diminished; and
   a third viewing region that is within a range of angles from the front of the LED light display apparatus that is farther from the front of the LED light display apparatus than the second viewing region, wherein light emission from the LED light display apparatus is eradicated or nearly-eradicated.

6. The LED light display apparatus of claim 1, further comprising at least one of the one or more blocking elements being horizontally light blocking louvers, that block light in at least one horizontal direction.

7. The LED light display apparatus of claim 1, further comprising at least one of the one or more blocking elements being reflection minimization louvers configured to incorporate:
a light emission blocking arm operable to block light emission from the LED diode proximate to the reflection minimization louver; and
a reflection blocking flange angled in relation to the reflection of light emitted from the LED diode to block all or a portion of such reflection.

8. A LED light display apparatus operable to control light emission in at least one direction and configured for installation and use in a predetermined upright position at or above eye-level of a viewer, comprising:
a printed circuit board (PCB);
one or more LED diodes connected to the PCB;
one or more blocking elements, each one of the one or more blocking elements comprising a light emission blocking arm positioned parallel to an arm, said light emission blocking arm and said arm being connected to and extending from opposite ends of a connection section in a U-shape, and a blocking flange extending from an end of the light emission blocking arm positioned opposite to the connection section and angled in relation to a reflection of light emitted from the LED diode so as to block all or a portion of such reflection, each one or more blocking elements in the LED light display apparatus being positioned:
in sufficient proximity to one of the one or more LED diodes such that said blocking element blocks light emitted from an entire surface of said LED diode excepting light emitted from a side of said LED diode that is opposite to said blocking element; and
in a vertical arrangement pattern with at least one LED diode; and
whereby light emitted from the LED light display apparatus when in the predetermined upright position at or above eye-level of a viewer is blocked from visibility in at least one horizontal direction at a range of angles from the front of the LED light display apparatus in such direction, and said light being viewable as one or more images providing information to the viewer in solely the unblocked directions; and
whereby light trespass is blocked at horizontal viewing angles of the LED light display apparatus.

9. The LED light display apparatus of claim 8, further comprising the one or more blocking elements configured to incorporate a section attachable to the PCB, and an arm that extends away from the PCB in the same direction as the one or more LED diodes extend away from the PCB, said arm being operable to block the light from at least a portion of the LED diode it is proximate to in the direction that the light is emitted from the LED diode towards the arm of the blocking element.

10. The LED light display apparatus of claim 9, further comprising the arm of the blocking element being any of the following shapes or configurations: flat sided, semi-circular cupped, or multi-segmented.

11. The LED light display apparatus of claim 9, further comprising any of the following elements configured to block light emission from the LED diode that the blocking element is positioned proximate to: a fin, a ridge, and a cup.

12. The LED light display apparatus of claim 8, further comprising three or more viewing regions in the area surrounding the LED light display apparatus when in the predetermined upright position at or above eye-level of a viewer, including at least the following:
a first viewing region that is in front of the LED light display apparatus and within a range of angles from the front of the LED light display apparatus wherein light emission from the LED light display apparatus is visible by a viewer;
a second viewing region that is within a range of angles from the front of the LED light display apparatus that is farther from the front of LED light display apparatus than the first viewing region, wherein light emission from the LED light display apparatus is diminished; and
a third viewing region that is within a range of angles from the front of the LED light display apparatus that is farther from the front of the LED light display apparatus than the second viewing region, wherein light emission from the LED light display apparatus is eradicated or nearly-eradicated.

13. The LED light display apparatus of claim 8, further comprising at least one of the one or more blocking elements being horizontally light blocking louvers, that block light in at least one horizontal direction.

14. An apparatus as defined in claim 8, wherein each pair of blocking elements in the array is configured to block all direct lines of sight from the light trespass viewing region to the respective diode.

15. An LED light display apparatus configured for installation and use in a predetermined upright position at or above eye-level of a viewer, comprising:
a printed circuit board (PCB);
LED diodes that are operatively connected to the PCB and oriented in horizontal rows when the apparatus is in the predetermined upright position; and
an array of blocking elements arranged in pairs, wherein the blocking elements in each pair are located at horizontally opposite sides of a respective diode when the apparatus is in the predetermined upright position, and each pair of blocking elements is configured to define distinct viewing regions with reference to horizontal angles at the front of the respective diode, including:
an optimal viewing region within a range of first horizontal angles, wherein light from the respective diode is not blocked by the blocking elements;
a transition viewing region located horizontally beside the optimal viewing region within a range of second horizontal angles greater than the first horizontal angles, wherein light is partially blocked by the blocking elements; and
a light trespass viewing region located horizontally beside the transition viewing region within a range of third horizontal angles greater than the second horizontal angles, wherein light is fully or nearly fully blocked by the blocking elements.

* * * * *